United States Patent
Arai et al.

(10) Patent No.: US 7,585,713 B2
(45) Date of Patent: Sep. 8, 2009

(54) METHOD FOR EXPOSING PHOTO-SENSITIVE SAM FILM AND METHOD FOR MANUFACTURING SEMICONDUCTOR DEVICE

(75) Inventors: Tadashi Arai, Kumagaya (JP); Takeo Shiba, Kodaira (JP); Masahiko Ando, Cambridge (GB)

(73) Assignee: Hitachi, Ltd., Tokyo (JP)

( * ) Notice: Subject to any disclaimer, the term of this patent is extended or adjusted under 35 U.S.C. 154(b) by 16 days.

(21) Appl. No.: 12/031,783

(22) Filed: Feb. 15, 2008

(65) Prior Publication Data
US 2008/0268582 A1 Oct. 30, 2008

(30) Foreign Application Priority Data
Apr. 27, 2007 (JP) .............................. 2007-117955

(51) Int. Cl.
*H01L 21/00* (2006.01)
(52) U.S. Cl. ................. 438/160; 977/896; 977/901
(58) Field of Classification Search ................. 438/160
See application file for complete search history.

(56) References Cited
U.S. PATENT DOCUMENTS
6,821,811 B2  11/2004  Hirakata et al.

2005/0245739 A1 * 11/2005 Fukushima et al. ......... 540/350

FOREIGN PATENT DOCUMENTS

| JP | 2003-158134 | 5/2003 |
|---|---|---|
| JP | 2003-321479 | 11/2003 |
| JP | 2004-080026 | 3/2004 |

* cited by examiner

*Primary Examiner*—W. David Coleman
*Assistant Examiner*—Daniel Shook
(74) *Attorney, Agent, or Firm*—Antonelli, Terry, Stout & Kraus, LLP.

(57) ABSTRACT

A disclosed technology is a method for exposing a photo-sensitive SAM film, wherein a self-assembled-monolayer (photo-sensitive SAM film) having photo-sensitivity, exhibiting hydrophobicity before exposure, and exhibiting hydrophilicity after exposure is formed on a substrate, exposure is performed to the substrate in a state in which a surface of the substrate on which the film has been formed is dipped in liquid or in a state in which a light-sensitive surface of the substrate faces downward to be in contact with liquid, exposure light is ultraviolet light, visible light, or light with an exposure-wavelength of 350 nm or more to 800 nm or less, and the liquid is at least one of organic solvent containing an aromatic group and organic solvent of alcohols, ethers, or ketones.

13 Claims, 22 Drawing Sheets

A —————————— A'

METHOD FOR EXPOSING PHOTO-SENSITIVE SAM FILM AND METHOD FOR MANUFACTURING SEMICONDUCTOR DEVICE

CROSS-REFERENCE TO RELATED APPLICATION

The present application claims priority from Japanese Patent Application No. JP 2007-117955 filed on Apr. 27, 2007, the content of which is hereby incorporated by reference into this application.

TECHNICAL FIELD OF THE INVENTION

The present invention relates to a method for exposing a photo-sensitive SAM film and a method for manufacturing a semiconductor device. More particularly, it relates to a method for manufacturing a semiconductor device including an organic thin film transistor, a method for exposing a self-assembled-monolayer film having photo-sensitivity, an organic thin film transistor using the self-assembled-monolayer film and a method for manufacturing the organic thin film transistor, and a semiconductor device including an organic thin film transistor and a method for manufacturing the semiconductor device.

BACKGROUND OF THE INVENTION

In recent years, various research and development of a display device including a thin film transistor (TFT) device have been conducted. Since this TFT is excellent in low power consumption and space-saving, it has been increasingly used as a transistor for driving a display device of a portable device such as a mobile phone, a notebook computer, or a PDA. Most of the TFTs mentioned above are fabricated from an inorganic semiconductor material such as crystalline silicon or amorphous silicon. This is because such a TFT can be fabricated by using conventional manufacturing process and manufacturing technology for a semiconductor device. In a case of using the manufacturing process of a semiconductor device, however, since a processing temperature in forming a semiconductor film reaches 350° C. or higher, a substrate on which the TFT can be formed is limited. In particular, since many flexible substrates such as a plastic substrate have the heatproof temperature of less than 350° C., it is difficult to use such a flexible substrate for the fabrication of a TFT made of an inorganic semiconductor material according to the usual semiconductor manufacturing process.

For the solution of this problem, recently, research and development of a TFT device using an organic semiconductor material (hereinafter, abbreviated to organic TFT) which can be fabricated at low temperature have been conducted. Since an organic semiconductor film of the organic TFT can be formed at low temperature, it is possible to form the organic TFT on a substrate with low heat resistance such as a plastic substrate. Therefore, it becomes possible to fabricate a novel device with a nonconventional flexibility.

As a method for forming an organic semiconductor film in forming an organic TFT, depending on the organic semiconductor material to be used, an optimal method has been used from among a printing method such as an ink jet, a spin-coating method, a spraying method, a transfer method, a deposition method, a dipping method, a casting method, and the like. For example, a low molecular compound such as pentacene derivatives is mainly formed by the deposition method, and a high molecular compound such as poly-thiophene derivatives is formed from a solution. As an example related to a method for manufacturing a semiconductor device including an organic thin film transistor, Japanese Patent Application Laid-Open Publication No. 2004-080026 (Patent Document 1) is known. This example has disclosed a technique for suppressing the usage of an organic semiconductor material by the use of the capillarity.

Recently, research and development for achieving the price reduction by fabricating a channel portion of a TFT from a small amount of an organic semiconductor material without wasting the organic semiconductor material by using a printing process such as an ink jet, a micro-dispensing, or a transfer method have been conducted. In addition, research and development for fabricating an electrode and a wiring portion by printing are beginning to be conducted.

SUMMARY OF THE INVENTION

As described above, a TFT manufacturing method using a printing technology has a feature that the price reduction can be achieved. In a current general printing technology, however, its alignment accuracy is about 10 μm, and even if the latest technology is used, it is about several μm. Therefore, it is difficult to fabricate a fine TFT by the printing process. In particular, when misalignment occurs between a gate electrode (lower electrode) and a source/drain electrode (upper electrode), a parasitic capacity is increased or performance variation is caused in the case where a plurality of TFTs are fabricated. It is said that this misalignment occurs at the time when the material jetted from a nozzle flies to a substrate in the ink-jet method. Also, it is said that it occurs at the time when the material is transferred from a transferring roller to a substrate in the transfer method.

For this reason, currently, the printing process is used for the organic semiconductor film formation and the wiring process, the conventional semiconductor process is used for the insulating film formation and the contact hole formation, and the printing or the conventional semiconductor process is used for the electrode formation. In this case, since both the processes are used in combination, fabrication apparatuses such as a photolithography related apparatus, a printer, a film forming apparatus, and an etching apparatus are wide-ranging and complicated, and a manufacturing cost increases because photomasks are required for the contact hole formation process, the electrode formation process, and the like.

As a measure for this problem, a method in which no misalignment occurs even without the photomask is beginning to be examined. For example, Japanese Patent Application Laid-Open Publication No. 2003-158134 (Patent Document 2) has disclosed a method of forming the gate patterns having no misalignment by the photolithography using a photo-sensitive composition performed from a rear surface with using the source and drain as a mask. Although the pattern formation without causing misalignment is possible by using this method, since the photo-sensitive composition photolithography process is performed and such processes as photo-sensitive composition application, heating, exposure, and development are included therein, extra cost and time are required for the respective processes and apparatuses to be used. Further, when the photo-sensitive composition photolithography process used in the common semiconductor process is used, there is a possibility that a special substrate such as a flexible substrate cannot be used. Further, when an organic type material such as plastic is used for a substrate, a problem occurs in which the substrate is dissolved in a photo-sensitive composition solvent.

Further, a method using a photo-sensitive Self-Assembled-Monolayer (hereinafter, photo-sensitive SAM) as the photo-sensitive composition has also been examined. The photo-sensitive SAM has a feature that a non-exposed portion is hydrophobic and an exposed portion becomes hydrophilic. By utilizing this feature, conductive material solution is selectively printed on the hydrophilic portion to form electrodes and wirings. As the photo-sensitive SAM materials, silane coupling agent containing a perfluoroalkyl group, silane coupling agent containing a photo-sensitive group of photo-sensitive composition such as resist, and the like have been reported. Since a photo-sensitive SAM containing a perfluoro group uses a reaction in which light with an extremely-short wavelength of about 200 nm is used to cut a main chain in order to develop a hydrophilic property and a general flexible substrate does not allow the transmission of a light of 300 nm or less therein, the above-described rear-surface exposure using the flexible substrate does not cause the photo-sensitive SAM to react. Further, since the photo-sensitive SAM including a resist photo-sensitive group can adjust the exposure wavelength by changing the photo-sensitive group, some photo-sensitive SAMs can react with a light transmitted through the flexible substrate. However, since an irradiation dose of about ten times as large as that in the common resist photolithography process is required so far in order to develop the hydrophilic property of the photo-sensitive SAM, there is a problem that much time is required.

For the problems described above, an object of the present invention is to provide a method for manufacturing a high-performance organic thin film transistor including electrodes having fine pattern shapes of about 20 μm formed in a short time by using a printing method, in which a lower electrode and an upper electrode aligned to suppress a misalignment therebetween of 1 μm or less without using a photomask face each other via an insulating film.

One of the gists of the present invention is as follows.

In a method for exposing a photo-sensitive SAM film, a self-assembled-monolayer (photo-sensitive SAM film) having photo-sensitivity, exhibiting hydrophobicity before exposure, and exhibiting hydrophilicity after exposure is formed on a substrate, exposure is performed to the substrate in a state in which a surface of the substrate on which the film has been formed is dipped in liquid or in a state in which a light-sensitive surface of the substrate faces downward to be in contact with liquid, exposure light is ultraviolet light, visible light, or light with an exposure-wavelength of 350 nm or more to 800 nm or less, and the liquid is at least one of organic solvent containing an aromatic group and organic solvent of alcohols, ethers, or ketones.

(1) Here, though any light can be used as the exposure light as long as the light can transmit through the substrate, specifically, it is desired that the exposure light is ultraviolet light, visible light, or light with an exposure-wavelength of 350 nm or more to 800 nm or less. The numeric limitation of the wavelength of the exposure light specifies a wavelength range desirable as a light transmitting through the substrate.

(2) Further, any liquid can be used as the liquid as long as a group cut out of the SAM after exposure can be solved in the liquid. More specifically, it is desirable that the liquid is at least one of organic solvent including an aromatic group and organic solvent of alcohols, ethers, or ketones.

The present invention provides a method for manufacturing a semiconductor device including an organic thin film transistor applicable to various substrates, in which the device is formed by using a printing method, and an upper electrode is disposed in a self-alignment manner with a lower electrode by using a difference in a contact angle of water or organic solvent between just above the lower electrode and the other portions through a photolithography process by the exposure from the rear surface using the lower electrode as a mask.

A representative embodiment of the present invention uses a manufacturing method in which a process for forming a source and drain electrode material by the use of a difference in the contact angle of water or organic solvent varied by the exposure without using a mask is used only for the process of alignment between the upper electrode and the lower electrode, and a printing method is used for all the other processes. A translucent substrate is prepared and a conductive material is printed and burned on the translucent substrate, thereby fabricating a non-translucent gate electrode (lower electrode). On the non-translucent gate electrode, a translucent insulating film and a photo-sensitive self-assembled-monolayer solution on which the contact angle of water or an organic solution varies by the exposure are sequentially stacked in required areas by the printing method. Then, while the substrate is dipped in alkaline aqueous solution or organic solvent or while a surface (surface on which the photo-sensitive self-assembled-monolayer is formed) of the substrate is brought into contact with alkaline aqueous solution or organic solvent, the photo-sensitive self-assembled-monolayer is exposed from the rear surface of the substrate with using the lower electrode as a mask. Thereafter, the substrate is rinsed with water to increase a difference in the contact angle of water or organic solvent between an exposed portion and an unexposed portion, and the conductive material solution is printed by the use of the difference, so that source and drain electrode patterns aligned with the lower electrode can be formed. In this manner, the accurate alignment between the lower electrode and the upper electrode can be achieved. Thereafter, an organic semiconductor material is printed or deposited just above the lower electrode, thereby forming an organic thin film transistor.

According to the embodiments of the present invention, it is possible to provide a semiconductor device including an organic thin film transistor having electrodes in which a lower electrode and an upper electrode accurately aligned by using a printing method within 1 μm face each other via an insulating film.

BRIEF DESCRIPTIONS OF THE DRAWINGS

DESCRIPTIONS OF THE PREFERRED EMBODIMENTS

Figure 1A:
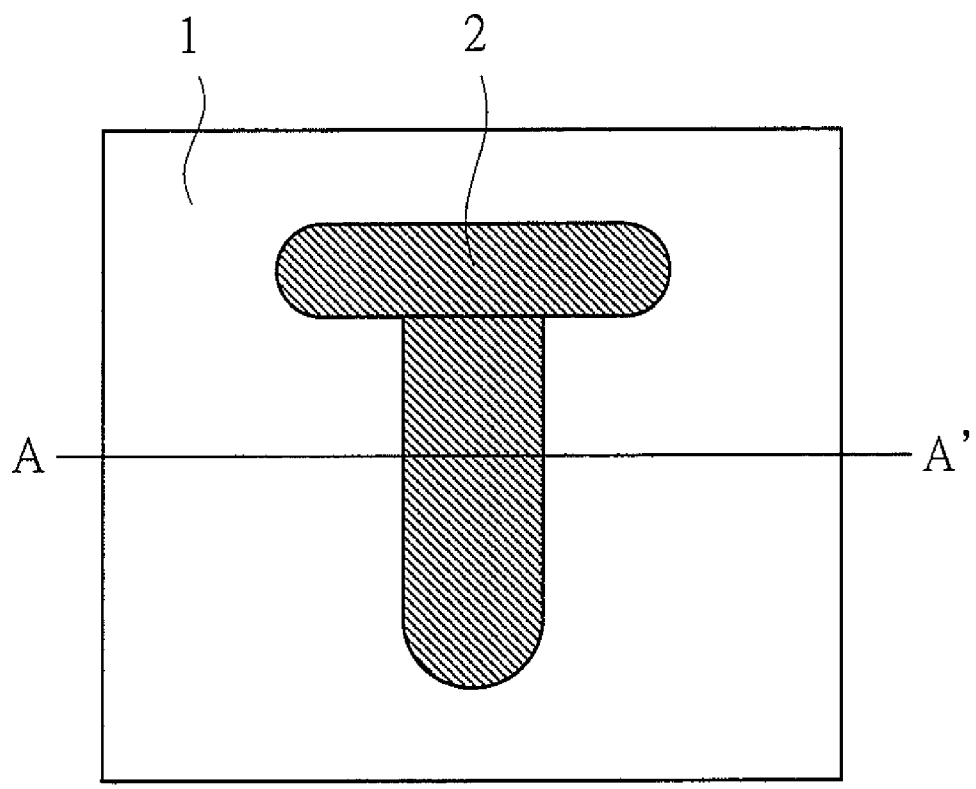
FIG. 1A is a plan view showing a manufacturing step of a transistor according to a second embodiment of the present invention.

In advance of describing various embodiments of the present invention of this application, a main embodiment of the present invention, specific materials to be used, and the like will be described in detail.

The gist of the present invention lies in a method for manufacturing an organic thin film transistor comprising, on a substrate made of a translucent material, a channel portion made of an organic semiconductor, an insulating film made of a translucent material in contact with the channel portion, a gate electrode made of a non-translucent material in contact with the insulating film, and a pair of source and drain electrodes separated by the channel portion, wherein, by the exposure from the rear surface of the substrate with using the gate electrode as a mask region performed in a state where the substrate is dipped in alkaline aqueous solution or organic solvent or in a state where a surface of the substrate is in contact with alkaline aqueous solution or organic solvent, end portions of the pair of both source and drain electrodes positioned on the gate electrode side are set. Further, it is preferable that the channel portion, the insulating film, the gate electrode, and the source and drain electrodes are formed by a printing method.

An example of the process of exposure for setting the end portions of the pair of both source and drain electrodes on the gate electrode side will be described as follows. That is, the process comprises a step of forming a non-translucent gate electrode (lower electrode) on a translucent substrate, a step of forming a translucent gate insulating film covering at least the gate electrode, a step of applying a photo-sensitive self-assembled-monolayer, a step of dipping the substrate in alkaline aqueous solution or organic solvent or a step of bringing the surface of the substrate into contact with alkaline aqueous solution or organic solvent, a step of performing exposure from the rear surface of the translucent substrate, a step of rinse-washing the substrate with water after the exposure, a step of printing a pattern with a conductive material solution on an exposed portion and burning the substrate to form source and drain electrodes (upper electrode), and a step of forming an organic semiconductor layer for forming a channel portion.

In this case, as a specific procedure, there are the following two representative procedures. That is, the first is the procedure in which the step of forming the organic semiconductor film is performed before the step of forming the upper electrode material layer. The second is the procedure in which the step of forming the organic semiconductor film is performed after the step of forming the upper electrode material layer.

In order to achieve the object of the present invention, it is more preferable that the step of forming a non-translucent gate electrode, a step of forming the gate insulating film, and the step of forming an electrode material layer at least on the gate insulating film are all performed by using the printing method.

As the coating method, an ink-jet method, a micro-dispensing method, a dipping method, a spin-coating method, a transfer method, and the like are representative examples. In order to achieve the object of the present invention, it is practical to use at least one of these methods for the formation of various portions.

Next, specific materials used in the embodiments of the present invention will be described.

A representative example of the translucent substrate is a silicon compound or an organic compound. Further, as specific examples of the translucent substrate, there are a glass plate, a quartz substrate, and a flexible resin sheet so-called a plastic film. As the plastic film, polyethylene terephthalate, polyethylene naphthalate, polyetherimide, polyethersulfone, polyetheretherketone, polyphenylene sulfide, polyacrylate, polyimide, polycarbonate, cellulose triacetate, cellulose acetate propionate, and the like can be taken as examples. A plastic film has a feature of flexibility, and the plastic film is advantageous in various applications in which a device is required to have flexibility.

The conductive material mentioned above is the ink containing metal, metal oxide, or conductive polymer material which takes a form of nanoparticle, complex, or polymer molecule and can disperse in a solvent to form a liquid material.

The translucent insulating film material mentioned above is an organic insulating polymer, and polyimide derivatives, benzocyclobutene derivatives, photoacryl derivatives, polystyrene derivatives, polyvinylphenol derivatives, polyester derivatives, polycarbonate derivatives, polyester derivatives, polyvinyl acetate derivatives, polyurethane derivatives, polysulfone derivatives, acrylate resin, acrylic resin, epoxy resin, and the like can be taken as examples. In addition, as the insulating material, such an inorganic material as silicon oxide, silicon nitride, silicon oxynitride, metal oxide, metal nitride, and metal oxynitride can also be taken as an example. Further, the insulating film may be either a single layer film or a multi-layer film, and the surface may be covered with a metal oxide for forming the photo-sensitive self-assembled monolayer.

As the organic semiconductor material, polyacene derivatives, typically represented by pentacene and rubrene, polythiophene derivatives, polyethylene vinylene derivatives, polypyrrole derivatives, polyisothianaphthene derivatives, polyaniline derivatives, polyacetylene derivatives, polydiacetylene derivatives, polyazulene derivatives, polypyrene derivatives, polycarbazole derivatives, polyselenophene derivatives, polybenzofurane derivatives, polyphenylene derivatives, polyindole derivatives, polypyridazine derivatives, metallophthalocyanine derivatives, fullerene derivatives, or polymers or oligomers comprising two or more kinds of such repetitive units in admixture can be taken as examples. Further, a doping treatment may be applied to the organic semiconductor materials described above if necessary. Further, in order to improve the performance of the organic semiconductor transistor, a surface treatment may also be applied to the bonding surface between the organic semiconductor and the substrate by the step before printing the organic semiconductor. Further, such organic semiconductors may be stacked according to need.

The photo-sensitive self-assembled-monolayer material mentioned above is a compound having a silane coupling agent at its distal end, and has a substituent group which develops a hydroxyl group by exposure. For example, a compound having a series of silane coupling agents described in Japanese Patent Application Laid-Open Publication No. 2003-321479 (Patent Document 3) is known.

As the organic alkaline aqueous solution, 2 w % to 25 w % aqueous solution, preferably, 2 w % to 5 w % aqueous solution of ammonium hydroxide compound represented by tetramethylammonium hydroxide or tetrabutylammonium hydroxide can be taken as an example.

As the organic solvent, aromatic compound represented by toluene, xylene, phenole and aniline, ethers represented by diethyl ether and tetrahydrofuran, alcohols represented by methanol and ethanol, ketones represented by acetone, amines represented by ammonia and triethylamine, and halogenated organic compounds such as chloroform and perfluoro hexane can be taken as examples. Of course, these solvents can be used independently or by mixture.

An example of the reaction of the photo-sensitive self-assembled-monolayer material will be described. The description will be made with using "Chemical Formula 1" (5-methoxy-2-nitro-benzyl 4-(trimethoxysilyl)butanesulfonate) which has been shown in Patent Document 3 as an example.

[Chemical Formula 1]

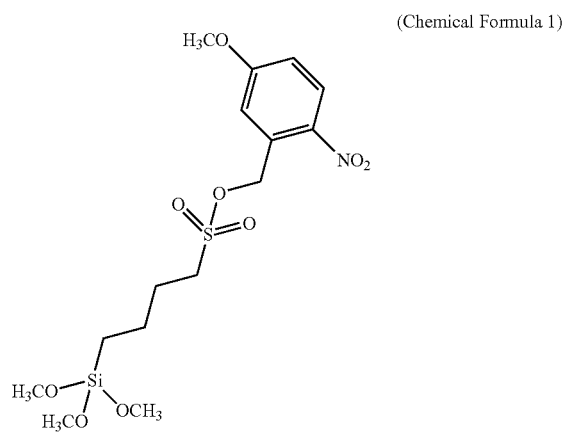

(Chemical Formula 1)

The "Chemical Formula 1" uses a trimethoxysilyl group to make a bond on a metal oxide surface. In a state of being aligned on a surface of a substrate, a contact angle of water exhibits 95°. In a state where "Chemical Formula 1" is aligned on the surface of the substrate, the substrate is dipped in a tetramethylammonium hydroxide solution (2.38 w %) while the surface thereof is faced down, and light of 350 nm is irradiated from the rear surface of the substrate. By this means, the bond is broken and a compound of "Chemical Formula 3" is formed through "Chemical Formula 2".

[Chemical Formula 2]

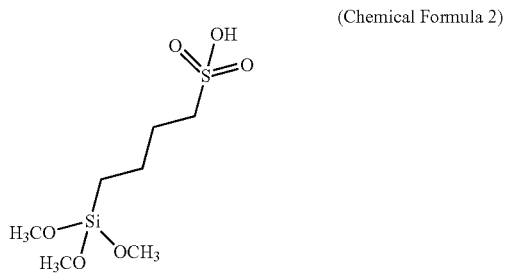

(Chemical Formula 2)

[Chemical Formula 3]

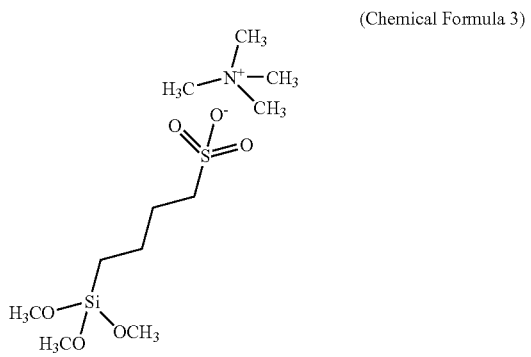

(Chemical Formula 3)

The contact angle of water at this time is 20°. Also, the contact angle of water of an unexposed portion is 95° throughout all the processes.

The solvent of the conductive material is the solvent in which the conductive material can be solved, and for example, water can be used. Further, as the organic solvent, general solvent for a photo-sensitive composition such as methylamyl ketone, ethyl lactate, cyclohexanone, propylene glycol monomethyl ether, or propylene glycole-1-monomethyl ether-2-acetate, ethers such as diethyl ether, acetone, and tetrahydrofuran, alcohols such as toluene, chloroform, and ethanol, and the like can be used. According to need, mixed solvent of two or more kinds thereof may be used.

As a method of forming the photo-sensitive self-assembled-monolayer, the ink-jet method, the micro-dispensing method, the dipping method, the spin-coating method, the transfer method, and the like are the representative examples.

Next, several embodiments of the present invention will be specifically described. Since an ink-jet printer used in the embodiments has a performance of 20 μm in both the positional accuracy and the drawing line width minimum value, a gate electrode line width is set to 20 μm.

Figure 21A:
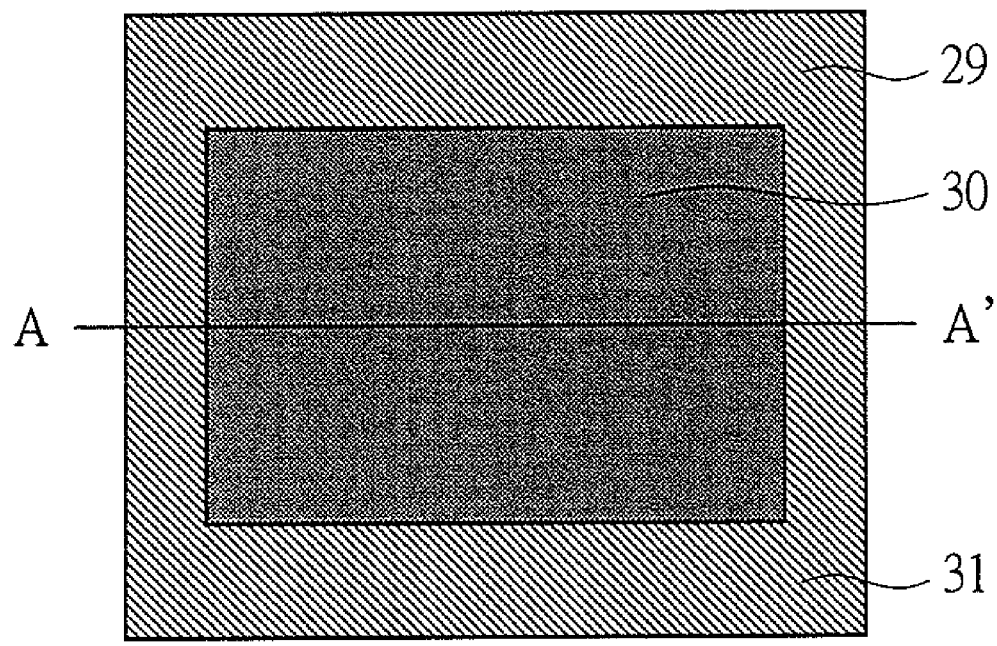
FIG. 21A is a plan view showing the state of a substrate in an exposure of a photo-sensitive self-assembled-monolayer in liquid according to the present invention.
Figure 21B:
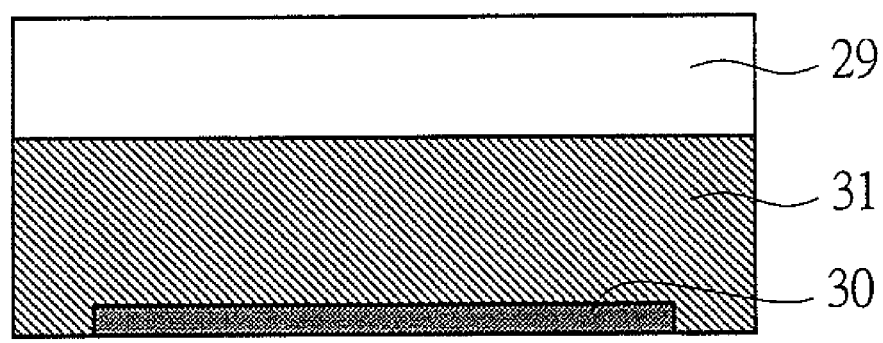
FIG. 21B is a sectional view showing the state of a substrate in an exposure of a photo-sensitive self-assembled-monolayer in liquid according to the present invention.
Figure 22A:
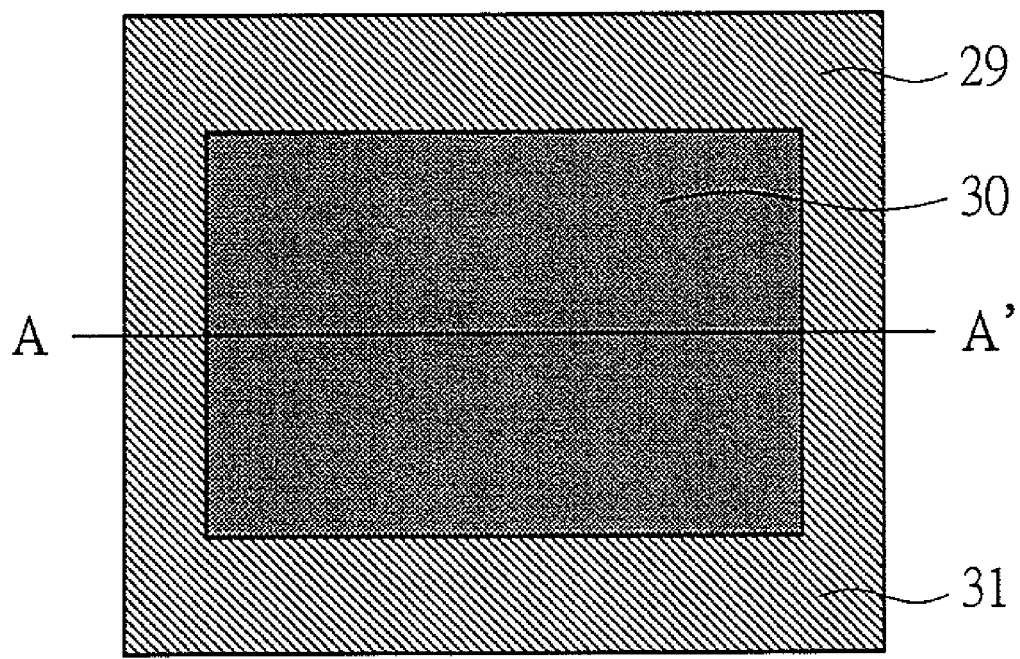
FIG. 22A is a plan view showing the state of a substrate in an exposure of a photo-sensitive self-assembled-monolayer in contact with liquid according to the present invention.
Figure 22B:
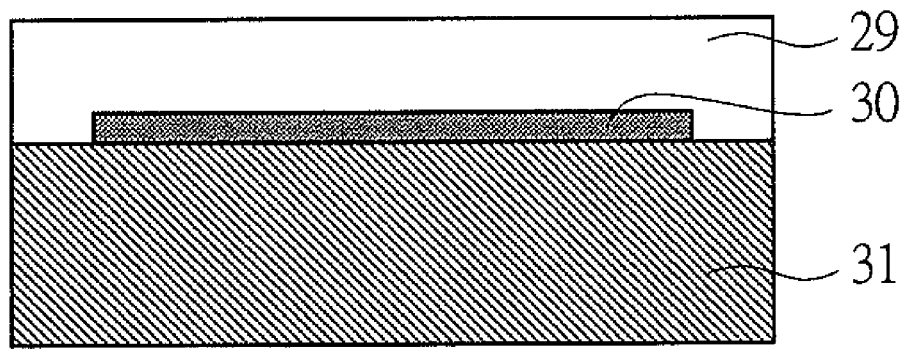
FIG. 22B is a sectional view showing the state of a substrate in an exposure of a photo-sensitive self-assembled-monolayer in contact with liquid according to the present invention.

The states of the substrate at the time of exposure will be described. First, FIG. 21A and FIG. 21B show a state of the substrate in the case where the substrate is dipped in alkaline aqueous solution or organic solvent and exposed. Alkaline aqueous solution or organic solvent 31 is put in a container for exposure 29. A substrate 30 is disposed in the container 29 so that the whole substrate 30 is dipped in the alkaline aqueous solution or the organic solution. In this case, according to need, the substrate is fixed in some way. It makes no difference if the front surface of the substrate faces upward or the rear surface thereof faces upward. Preferably, when the exposure is performed by using a photomask, the front surface of the substrate faces upward, and when the rear surface exposure is performed with using a pattern disposed in the substrate as a mask, the front surface of the substrate faces downward. Next, FIG. 22A and FIG. 22B show a state of the substrate in the exposure performed while the substrate and the liquid are brought into contact with each other. The alkaline aqueous solution or the organic solvent 31 is put into the container for exposure 29. In this state, the surface of the substrate 30 is turned downward, and the substrate is disposed so that the surface of the substrate comes in contact with the alkaline aqueous solution or the organic solvent. In this case, the substrate 30 may be floated on the alkaline aqueous solution or the organic solvent due to surface tension.

Figure 23:
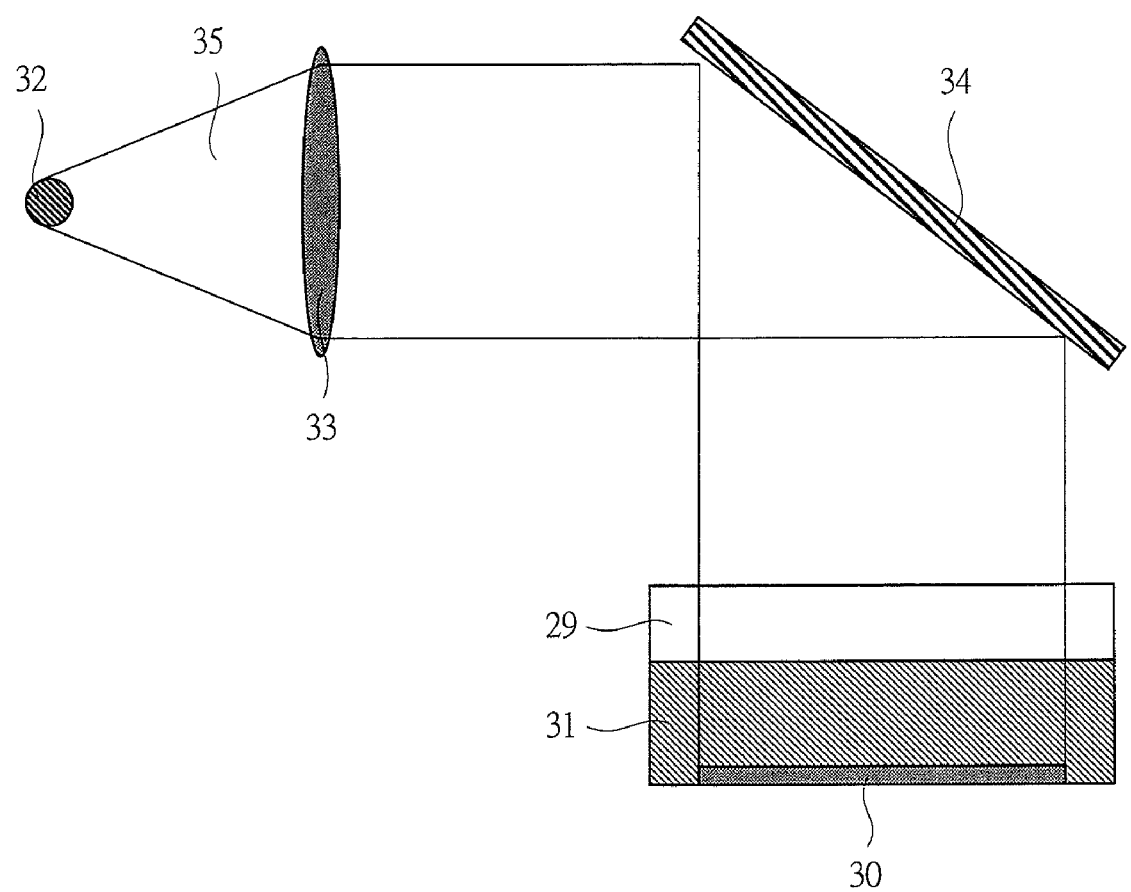
FIG. 23 is a layout diagram showing a system used for an exposure according to the present invention.

FIG. 23 shows an exposing method in the above-described exposure. The state of the substrate can be either of the state shown in FIG. 21A and FIG. 21B or the state shown in FIG. 22A and FIG. 22B. Though the case shown in FIG. 23 adopts the state of the substrate shown in FIG. 21A and FIG. 21B, there is no problem in adopting the state shown in FIG. 22A and FIG. 22B. A light source 32 emitting light including the absorption wavelength of a photo-sensitive SAM is prepared, and light 35 from the light source is collimated to a parallel light by using a lens system 33. When the light source itself emits parallel light like a laser, the lens system may be unnecessary. The size of the parallel light is required to be equal to or larger than a pattern-required area in the substrate. This parallel light is emitted vertically to the substrate by using a mirror system 34. Here, when the light source is positioned just above the substrate, the mirror system is not required. Further, when a photomask is used, the photomask may be disposed at any position between the light source and the lens system, in the lens system, between the lens system and the mirror system, in the mirror system, or between the mirror system and the substrate.

First Embodiment

A photo-sensitive SAM film is formed on a silicon wafer by dipping the silicon wafer in 0.1 w % toluene solution of a photo-sensitive self-assembled-monolayer material (5-methoxy-2-nitro-benzyl 4-(trimethoxysilyl)butanesulfonate) for 20 minutes. The contact angle of water of the surface of the substrate at this time is 95°. Three pieces of such substrates are prepared, and one of them is exposed in the atmosphere and the other two substrates are respectively exposed in toluene and in tetramethylammonium hydroxide (TMAH) 2.38 w % aqueous solution in the exposure system shown in FIG. 23 with using a high pressure mercury lamp as a light source.

As a result, in order to decrease the contact angle completely, an irradiation dose of 40 J/cm² is required in the atmosphere. Further, it is found that, in the exposure in toluene and TMAH, the contact angle settles at 20° by an irradiation dose of 6 J/cm² which is about one-sixth of the irradiation dose in the exposure in the atmosphere. As described above, it is found that the irradiation dose can be reduced to one-sixth by performing the exposure in liquid.

Incidentally, in the case of the exposure in toluene, the substrate is dipped in TMAH for one minute before the rinse after the exposure.

Second Embodiment

FIG. 1A to FIG. 8B are plan views and sectional views of a device shown in order of manufacturing steps of this embodiment in which source and drain electrodes are formed by exposure from the rear surface of the substrate. FIG. 1A to FIG. 8A are top views, and FIG. 1B to FIG. 8B are sectional views taken along the line A-A' in respective FIG. 1A to FIG. 8A. In the top views and the sectional views of the device shown in order of the manufacturing steps in the specification of this application, FIG. 1A to FIG. 8A show top views and FIG. 1B to FIG. 8B show sectional views.

Figure 1B:
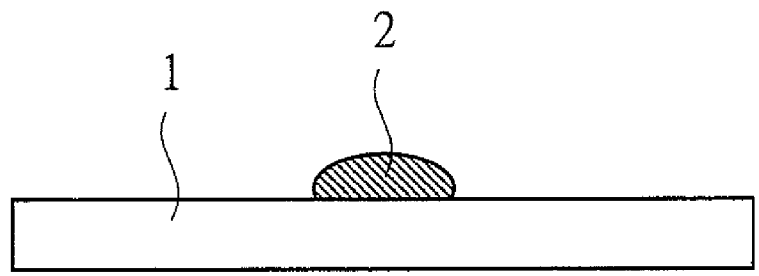
FIG. 1B is a sectional view showing the manufacturing step of the transistor according to the second embodiment of the present invention.

Polycarbonate which is an organic compound is used as a translucent substrate 1, and a gate electrode shape with a line width of 20 μm is printed on the substrate 1 by the ink-jet printing method with using gold nanoparticles dispersed in toluene solution as ink. Then, the substrate 1 is heated for 5 minutes at 200° C., thereby forming a gold gate electrode 2 (top view: FIG. 1A, sectional view: FIG. 1B). The height of the gate electrode thus fabricated is about 10 μm. The particle size of metallic cores of the gold nanoparticles is 3.5 nm on average, and the periphery of the metallic core is covered with butanethiolate. Incidentally, the gold gate electrode 2 in the top view in FIG. 1A is depicted to be in a T-shape composed of two parts, that is, a vertical part and a horizontal part.

These parts of the gold gate electrode 2 integrally constitute a gate electrode portion. Therefore, whether the gate electrode with the T-shape is integrally formed or the gate electrode is formed from at least two parts is arbitrarily selected, and a suitable manufacturing method can be arbitrarily selected depending on the structure of the gate electrode portion. In the ink-jet printing of this embodiment, it is more suitable to divide the gate electrode into two parts and scan them to form the gate electrode portion. On the other hand, in a case of the transfer method, for example, it is advisable to integrally transfer the T shape of the gate electrode. The same is true in the respective top views below, for example, FIG. 2A, FIG. 3A, FIG. 4A, FIG. 5A, FIG. 6A (though all the figure numbers subsequent thereto are not mentioned), and the like, and the gate electrode is depicted in these figures so that it looks divided into two parts.

Figure 2A:
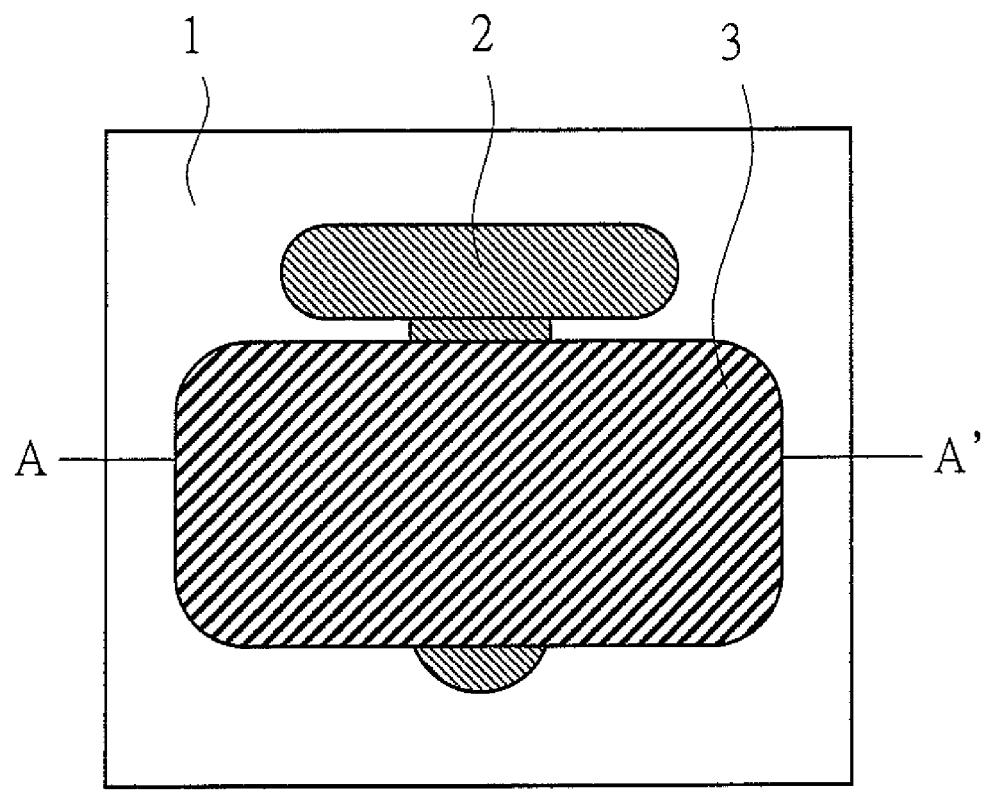
FIG. 2A is a plan view showing a manufacturing step of the transistor according to the second embodiment of the present invention.
Figure 2B:
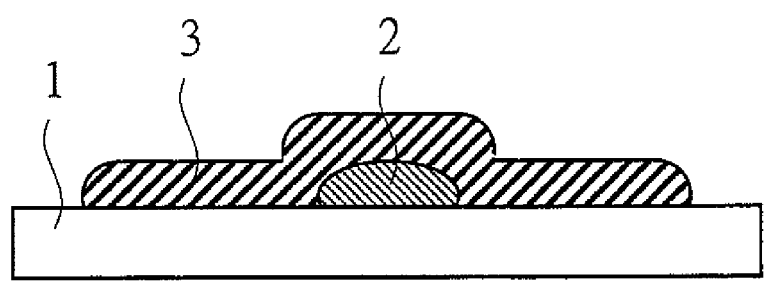
FIG. 2B is a sectional view showing the manufacturing step of the transistor according to the second embodiment of the present invention.
Figure 3A:
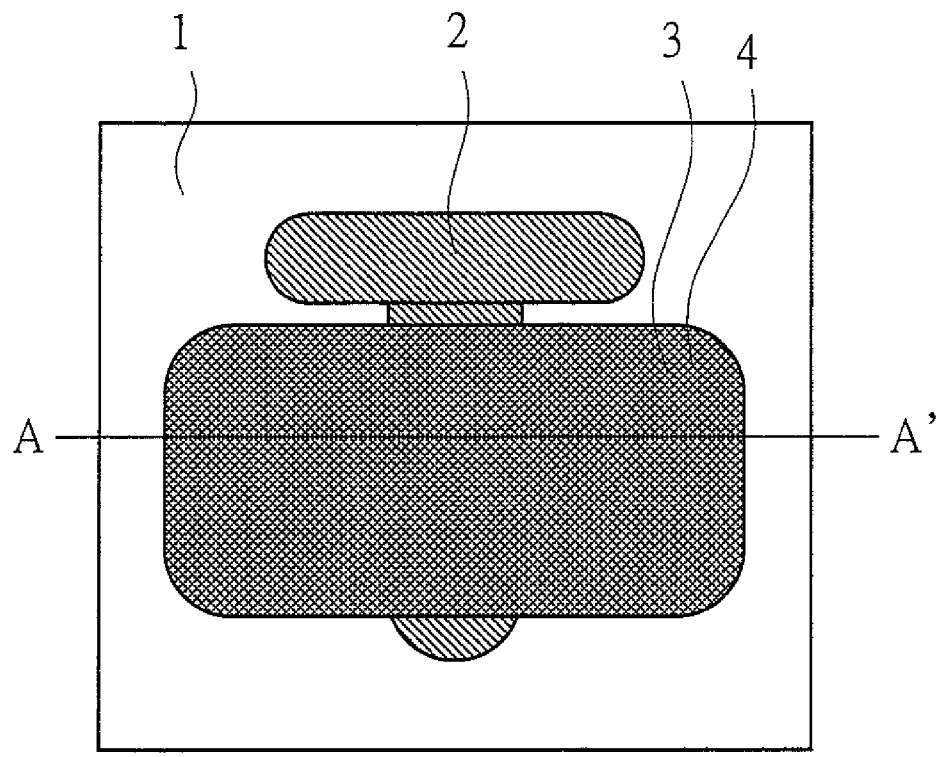
FIG. 3A is a plan view showing a manufacturing step of the transistor according to the second embodiment of the present invention.
Figure 3B:
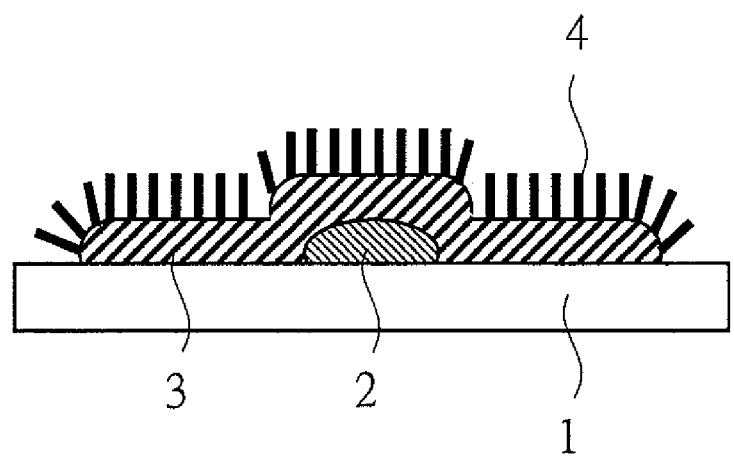
FIG. 3B is a sectional view showing the manufacturing step of the transistor according to the second embodiment of the present invention.

Next, a gate insulating film shape is formed by the ink-jet printing method using a 10 w % methyl isobutyl ketone solution of Poly(methyl silsesquioxane), and a heat treatment is performed for 20 minutes at 150° C., thereby forming a gate insulating film 3 at a necessary portion (top view: FIG. 2A, sectional view: FIG. 2B). The film thickness of the gate insulating film 3 is about 100 nm. Further, in consideration of the misalignment, the gate insulating film 3 is patterned by 20 μm larger than the width of source/drain electrodes to be formed later. Next, the substrate is dipped for 10 minutes in a 0.1 w % toluene solution of the photo-sensitive self-assembled-monolayer material (5-methoxy-2-nitro-benzyl 4-(trimethoxysilyl)butanesulfonate), rinsed with toluene, dried, and then burned for 10 minutes at 110° C., so that a photo-sensitive self-assembled-monolayer 4 is formed on the insulating film 3 (top view: FIG. 3A, sectional view: FIG. 3B). The contact angle of water of the self-assembled-monolayer before the exposure is 95°.

Figure 4A:
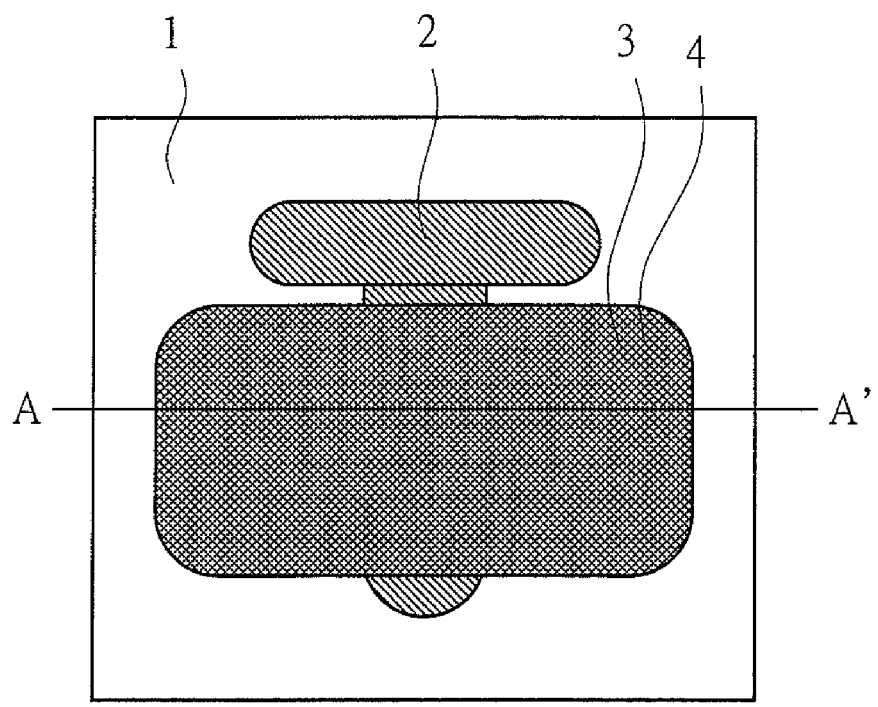
FIG. 4A is a plan view showing a manufacturing step of the transistor according to the second embodiment of the present invention.
Figure 4B:
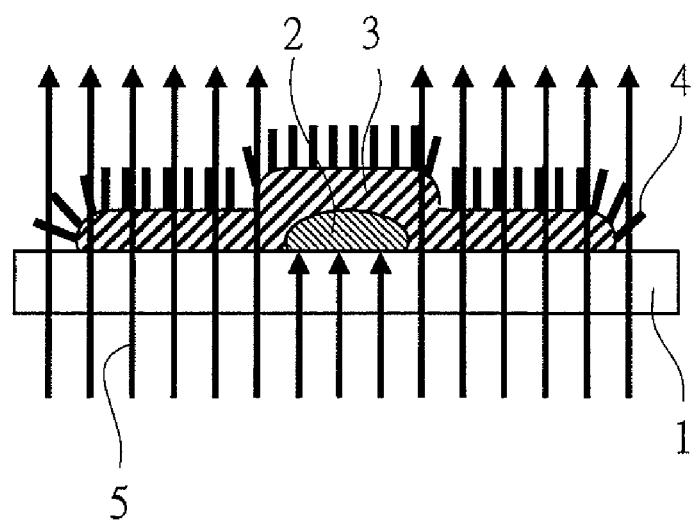
FIG. 4B is a sectional view showing the manufacturing step of the transistor according to the second embodiment of the present invention.
Figure 5A:
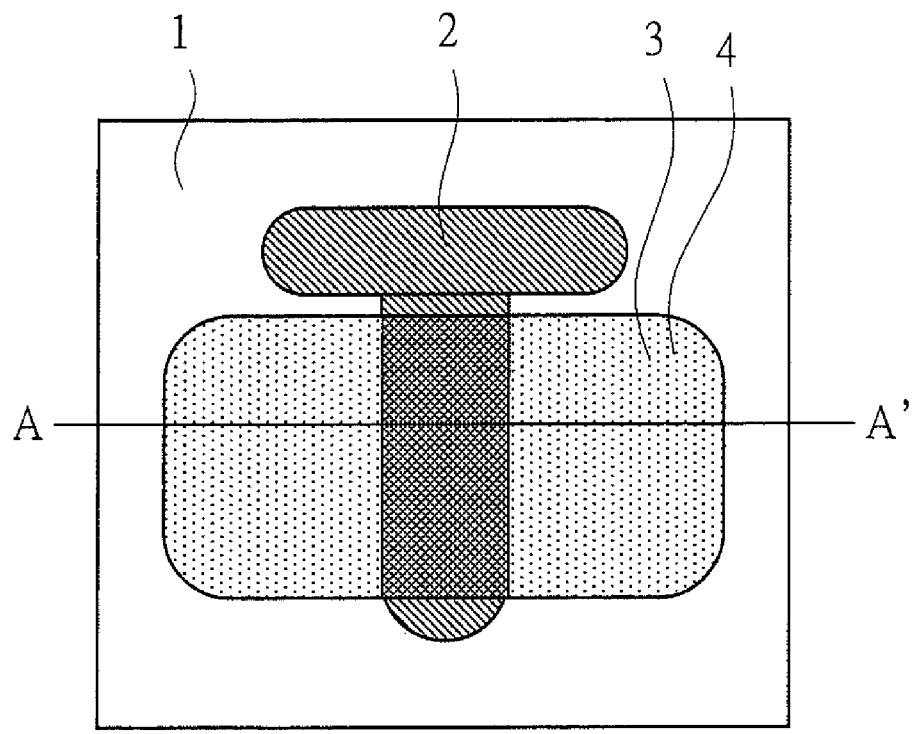
FIG. 5A is a plan view showing a manufacturing step of the transistor according to the second embodiment of the present invention.
Figure 5B:
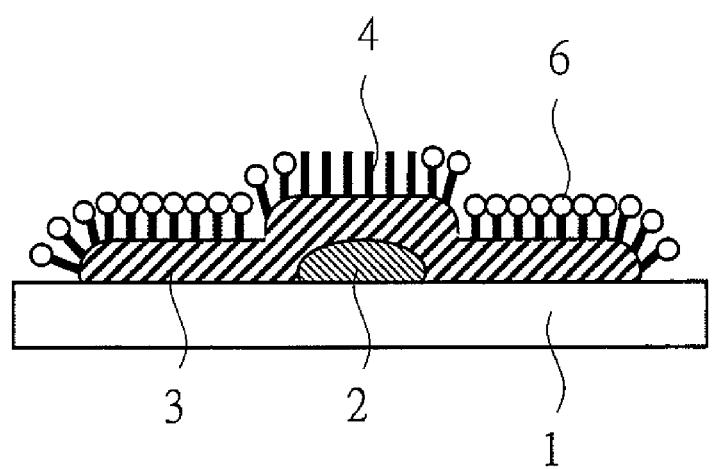
FIG. 5B is a sectional view showing the manufacturing step of the transistor according to the second embodiment of the present invention.
Figure 6A:
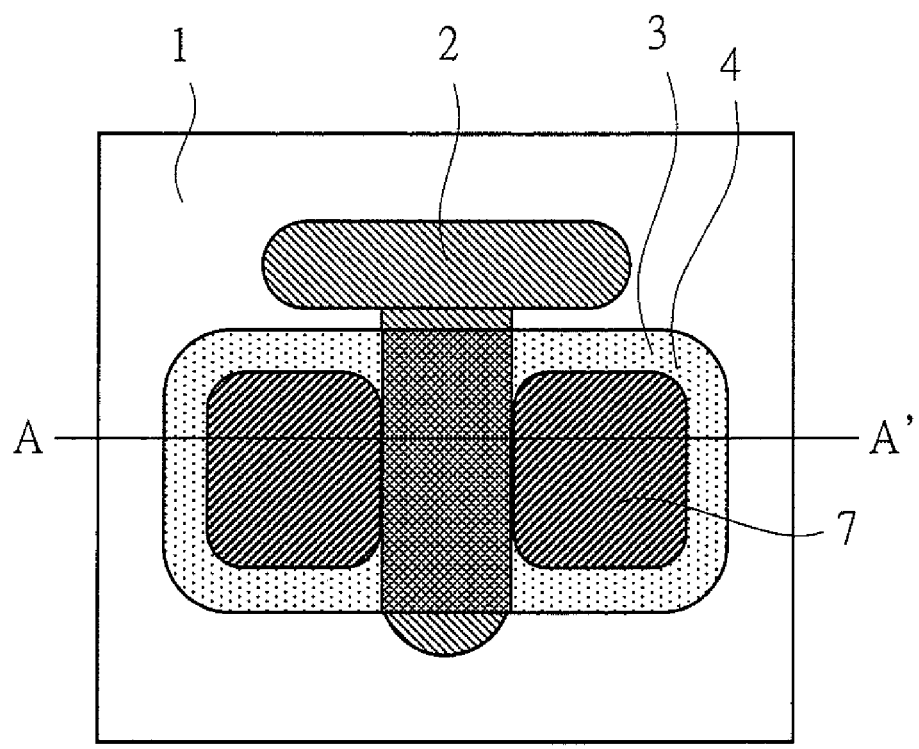
FIG. 6A is a plan view showing a manufacturing step of the transistor according to the second embodiment of the present invention.
Figure 6B:
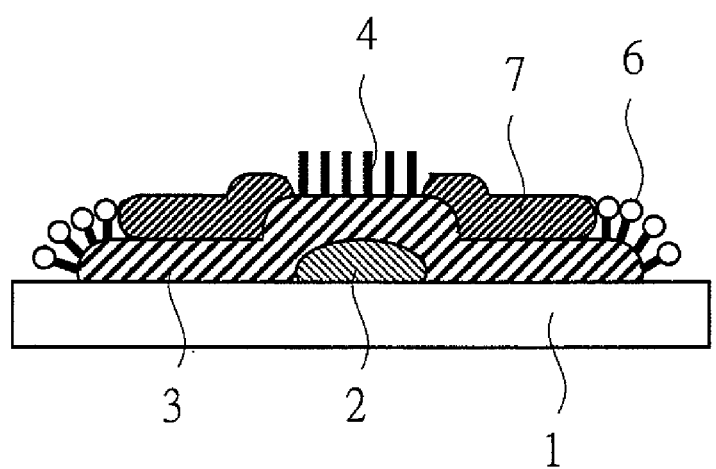
FIG. 6B is a sectional view showing the manufacturing step of the transistor according to the second embodiment of the present invention.

After the substrate is put into the state shown in FIG. 21, it is exposed for 20 minutes with using a high pressure mercury lamp as a light source from the rear surface of the substrate by using the exposure system in FIG. 23 (top view: FIG. 4A, sectional view: FIG. 4B). As the liquid in which the substrate is dipped at this time, 2.38 w % aqueous solution of tetramethylammonium hydroxide is used. After the exposure, the substrate is washed for 2 minutes with running deionized water (top view: FIG. 5A, sectional view: FIG. 5B). The contact angle of water of the self-assembled-monolayer at an exposed portion at the end of this step is 20°, and the contact angle thereof at an unexposed portion is unchanged, that is, 95°. Source and drain electrodes 7 are printed on the exposed portion using the same gold nanoparticle solution as the gate material by the ink-jet method, and are burned for 5 minutes at 200° C. (top view: FIG. 6A, sectional view: FIG. 6B). The film thickness of an electrode pattern 7 is about 5 μm. The amount of misalignment between the gate electrode and the source and drain electrodes at this time is 0.5 μm.

Figure 7A:
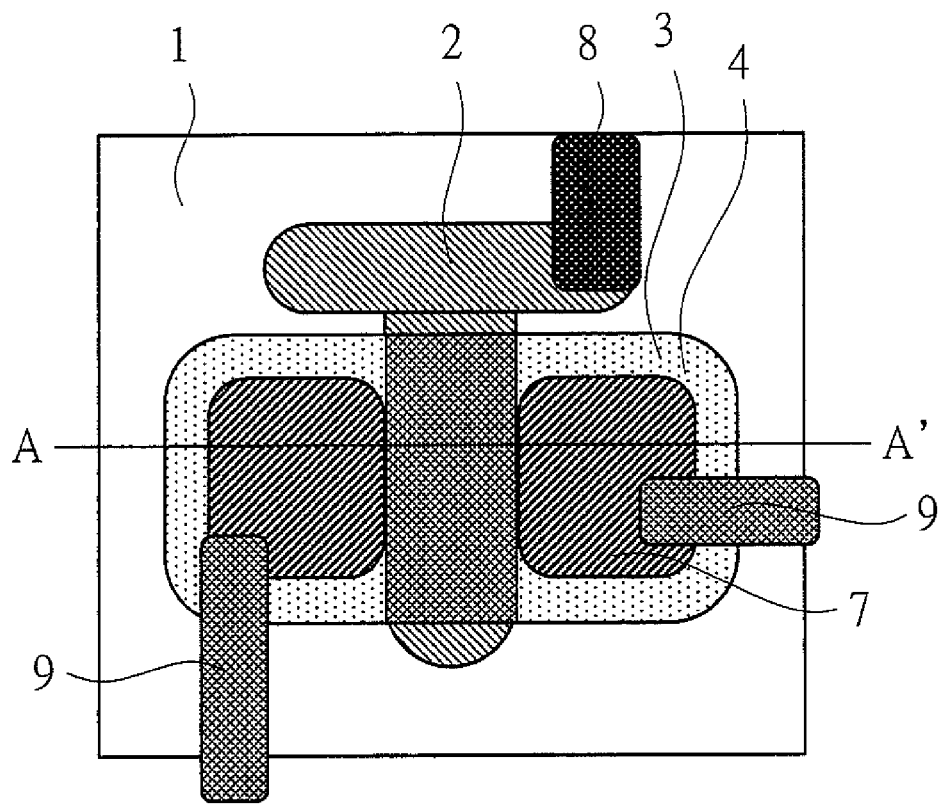
FIG. 7A is a plan view showing a manufacturing step of the transistor according to the second embodiment of the present invention.
Figure 7B:
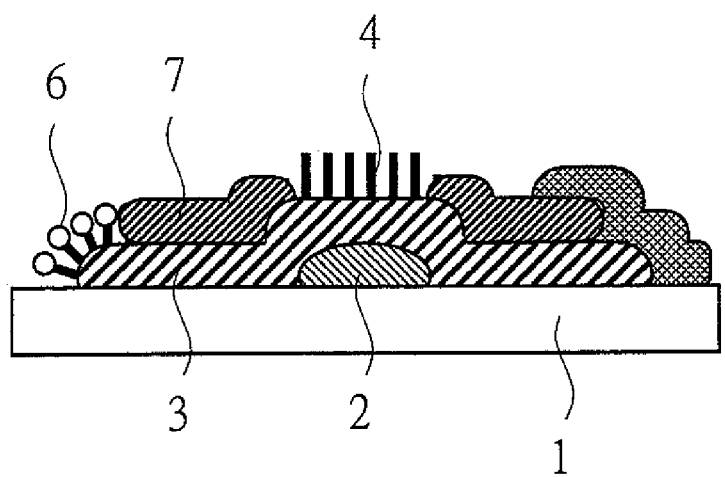
FIG. 7B is a sectional view showing the manufacturing step of the transistor according to the second embodiment of the present invention.
Figure 8A:
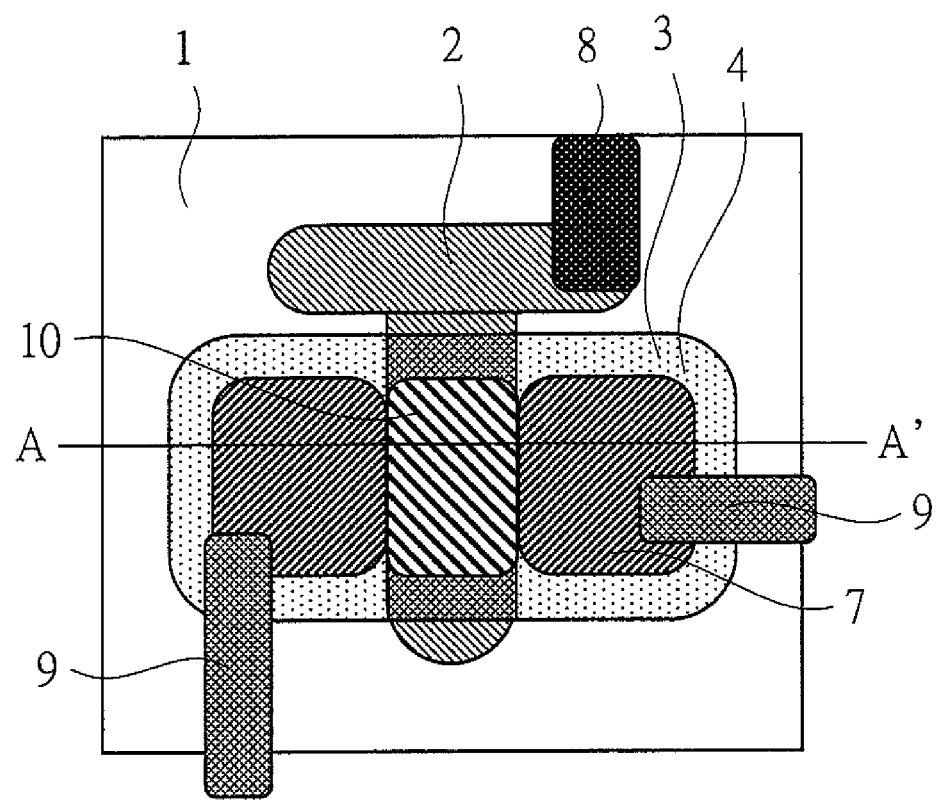
FIG. 8A is a plan view showing a manufacturing step of the transistor according to the second embodiment of the present invention.
Figure 8B:
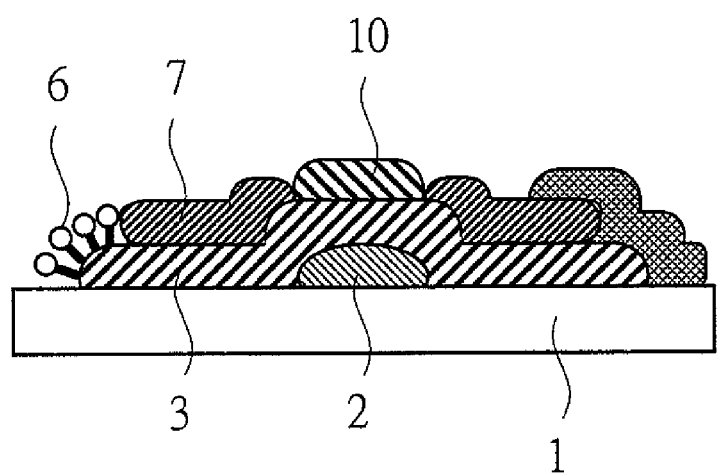
FIG. 8B is a sectional view showing the manufacturing step of the transistor according to the second embodiment of the present invention.

Next, a wiring 8 and a wiring 9 are printed by the ink-jet printing method using the gold nanoparticle toluene solution similar to that used in the gate electrode formation, and are subjected to a heat treatment for 5 minutes at 200° C. (top view: FIG. 7A, sectional view: FIG. 7B). At this time, the film thicknesses of the wirings are 0.5 μm. Next, a channel portion 10 is printed between the source electrode 7 and the drain electrode 7 just above the gate electrode 2 by the ink-jet printing method using chloroform 5% solution of organic semiconductor (Poly(3-hexylthiophene-2,5-diyl)Regioregular), and is subjected to a heat treatment for 2 minutes at 180° C. (top view: FIG. 8A, sectional view: FIG. 8B). The thickness of the channel portion 9 is 5 μm.

The mobility of this transistor is measured and is 0.085 $cm^2/Vs$. This value corresponds to a characteristic of an organic thin film transistor probably not having the misalignment between the upper electrode and the lower electrode.

The formation of the insulating film 3 and the organic semiconductor layer 10 can be performed also by the spin-coating method. The mobility of the organic thin film transistor obtained by the spin-coating method is equivalent to that in the printing method. However, the above-described printing method is more advantageous in comparison with the case of the formation by the spin-coating method because the respective solutions are not wasted.

Third Embodiment

Figure 9:
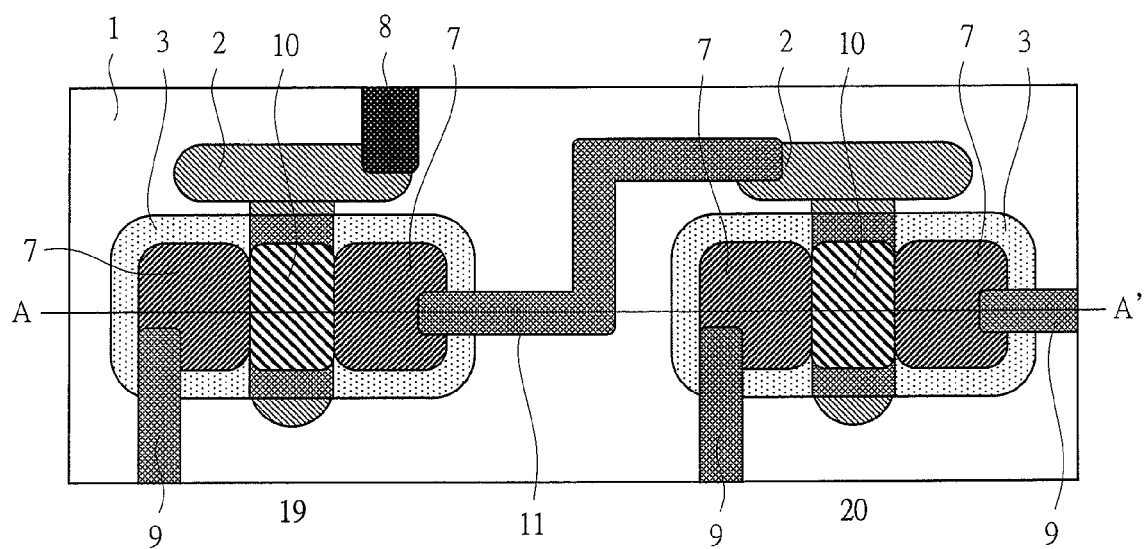
FIG. 9 is a plan view showing a semiconductor device according to a third embodiment of the present invention.
Figure 10:
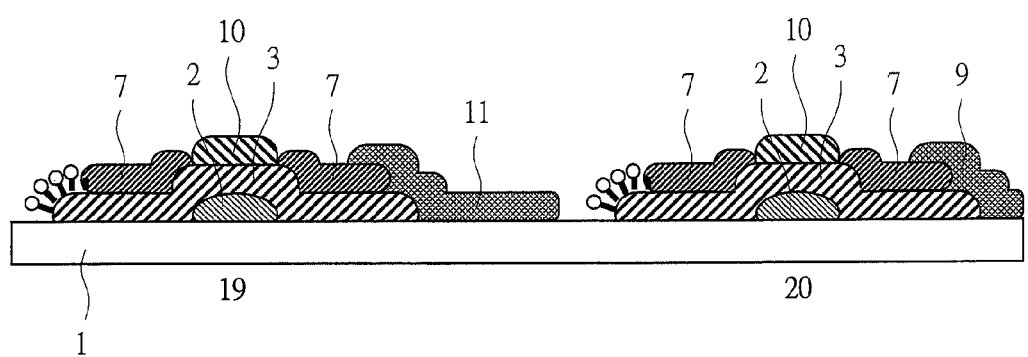
FIG. 10 is a sectional view showing the semiconductor device according to the third embodiment of the present invention.

This embodiment describes an example in which two organic semiconductor transistors (19, 20) are formed by the same method as that used in the second embodiment. A top view and a sectional view of this embodiment are shown in FIG. 9 and FIG. 10. A method for forming the respective transistors is similar to that used in the above-described first embodiment, but in the configuration of this embodiment, after the respective transistors are formed, a drain electrode 6 of a first transistor 19 of the transistors and a second gate electrode 2 of the other transistor 20 are connected to each other through a wiring 11. FIG. 9 shows the top view and FIG. 10 shows the sectional view taken along the line A-A' in FIG. 9. Performances of both the transistors are exactly the same, and the transistors having no performance variation can be fabricated.

In the second and the third embodiments, representative examples which are especially high-quality in both cost and performance have been shown. Hereinafter, various examples in which changes are made for the materials of the above embodiments will be described.

<Substrate>

An organic thin film transistor is formed in the same manner as the second embodiment except that the translucent substrate in the second embodiment is replaced with a glass substrate which is a silicon compound. The mobility of this transistor is 0.11 cm$^2$/Vs, which is equivalent to that of the plastic substrate.

<Conductive Material>

A transistor is formed in the same manner as the second embodiment except that the gold nanoparticles in the second embodiment are replaced with silver nanoparticles. The mobility of this transistor is 0.077 cm$^2$/Vs. When platinum nanoparticles are used, the mobility thereof is 0.1 cm$^2$/Vs, and when copper nanoparticles are used, the mobility thereof is 0.08 cm$^2$/Vs. More specifically, performances equivalent to that when using the gold nanoparticles can be obtained. In the respective materials, though there is a difference in characteristics caused from a difference in work function of, for example, gold and silver, the object of the present invention of this application can be sufficiently achieved. Among these materials, the gold nanoparticles are the most advantageous material from the aspects of performance, easiness of synthesis, and further preservation stability. Further, in the case where doped PEDOT which is a conductive polymer is used, the mobility thereof is 0.08 cm$^2$/Vs, and the performance equivalent to that of the above-described case of using the gold nanoparticles is obtained.

<Organic Semiconductor Material>

A transistor is formed in the same manner as the first embodiment except that the gold nanoparticle solution in the third embodiment is replaced with, for example, polyaniline solution doped with emeraldine salt. The mobility of this transistor is 0.05 cm$^2$/Vs. Such an example is sufficiently able to achieve the object of the present invention of this application.

Further, a transistor is formed by using the 1.3 wt % aqueous solution of the organic semiconductor Poly(styrenesulfonate)/poly(s, 3-dihydrothieno-[3,4-b]-1,4-dioxin) in the second embodiment. The mobility of this transistor is 0.078 cm$^2$/Vs. This example is slightly advantageous in cost.

Further, when pentacene is used in the deposition method, the mobility of the transistor is 0.09 cm$^2$/Vs. Though the printing method is not used in this case, there is not much of a difference in cost between them because of partial replacement.

<Insulating Film>

In the case where 0.5% xylene solution of epoxidized polybutadiene is used for the insulating film in the second embodiment, the mobility in this case is 0.09 cm$^2$/Vs. This value is approximately equivalent to that in the second embodiment. This example is slightly advantageous in cost.

Further, since the mobility in a case of using a 2% methyl amyl ketone solution of polyhydroxy styrene for the insulating film is 0.07 cm$^2$/Vs, the object of the present invention can be achieved. Polyhydroxy stylene in this example is inexpensive and has an advantage that methyl amyl ketone which is a safe solvent can be used. Further, since the mobility in a case of using a 3% methyl amyl ketone solution of polyimide is 0.07 cm$^2$/Vs, the object of the present invention can be achieved. In this case, since the transmission is lowered slightly, the exposure time of the photo-sensitive self-assembled-monolayer increases. When these organic polymer compounds are used as the insulating film, it is necessary to form a siloxane compound film or a silazane compound film on the surface of the insulating film in order to form the photo-sensitive self-assembled-monolayer, so that costs and steps slightly increase.

In the foregoing, several examples of the above-described various materials have been specifically described.

The present invention of this application has been described above in detail. According to the present invention, in the organic semiconductor manufacturing process, (1) necessary materials are drawn in necessary areas by the printing method, and (2) a portion where the alignment of the lower electrode and the upper electrode is required is fabricated by aligning the lower electrode and the upper electrode in a self-alignment manner. Therefore, an electrode substrate in which the lower electrode and the upper electrode are accurately aligned via an insulating film can be formed by using the printing method. With the printing method of the present invention, it is only necessary to use the necessary materials in the minimum area. In addition, a photomask and a resist lithography step are not required, and an etching step for forming through holes is not required. Therefore, the manufacturing cost can be significantly reduced.

In the present invention, since all of the formation steps can be performed at low temperature, the upper wiring/electrode can be formed in a self-alignment manner with the lower electrode even when the substrate is formed of a material such as plastic which is flexible and has the thermoplasticity that the material may be deformed due to heat.

The present invention is preferable for a substrate for making a display like a flexible electronic paper using such a substrate.

Fourth Embodiment

Figure 11A:
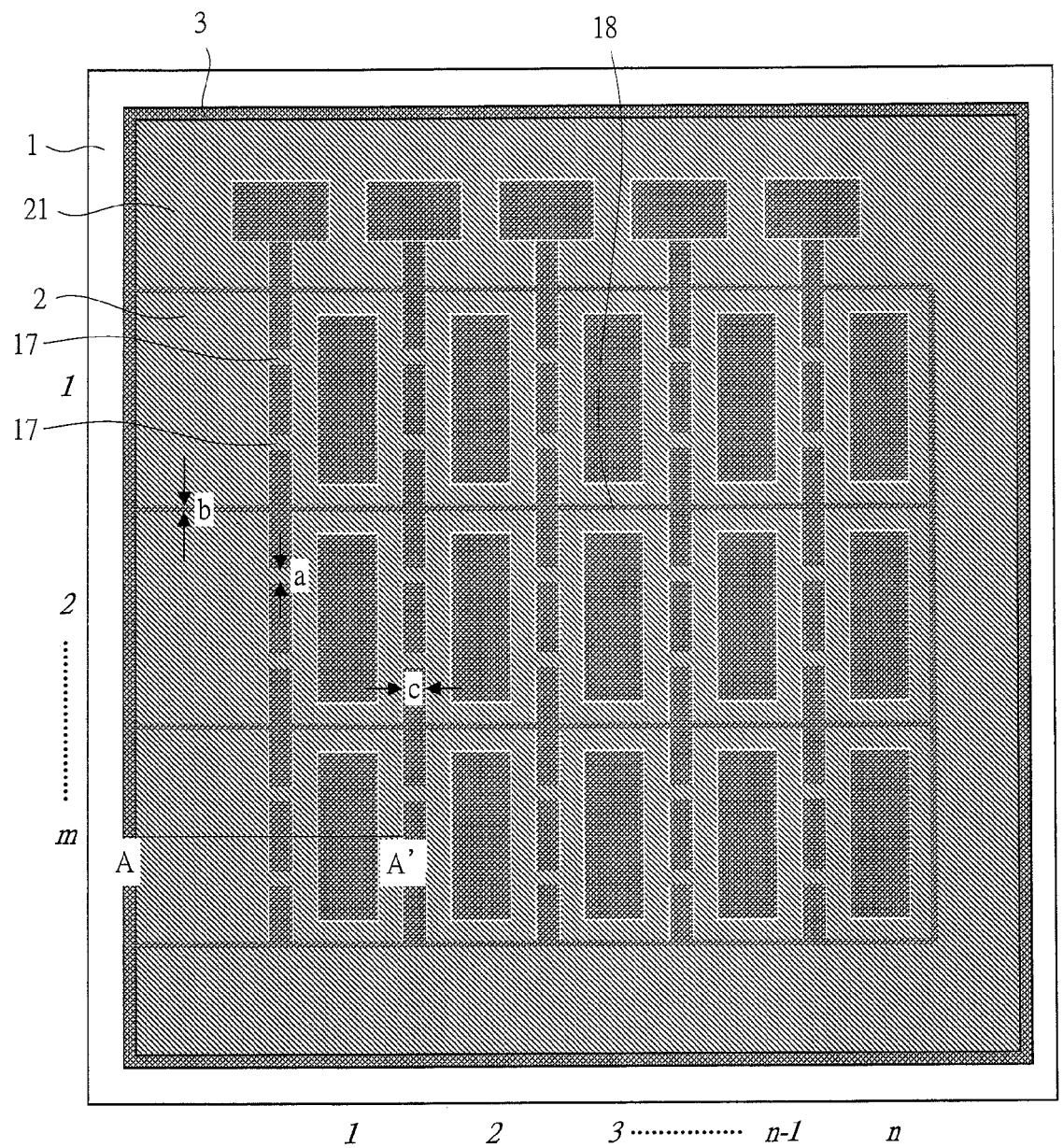
FIG. 11A is a plan view showing a manufacturing step of a transistor according to a fourth embodiment of the present invention.
Figure 11B:
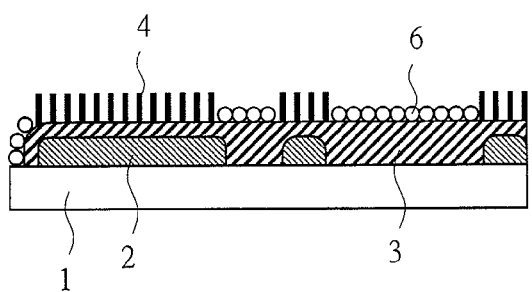
FIG. 11B is a sectional view showing the manufacturing step of the transistor according to the fourth embodiment of the present invention.

In this embodiment, an m-row n-column active matrix thin film transistor substrate comprising m×n thin film transistors formed at intersecting portions of m gate electrode wirings constituting at least a part of a lower electrode and n signal wirings constituting at least a part of an upper electrode and a method for manufacturing the same will be described with reference to FIG. 11A to FIG. 14B. A basic fabrication procedure is the same as that in the third embodiment. First, m gate wirings/electrodes 2 each having n ring-shaped rectangles with openings which are disposed adjacent to one another and connected by at least one connecting portion 17 (two portions in this example) are disposed close to one another via a space 18 (top view: FIG. 11A, sectional view: FIG. 11B). In particular, when a width b of the space 18 and a width a of the individual connecting portion 17 are set to be equal to or narrower than a space c between the ring-shaped rectangles with the openings, by applying conductive material solution to the space c and burning the same, n upper electrodes 23 functioning as signal wirings/drain electrodes can be formed in a linear shape self-aligned with the lower electrode beyond a hydrophilic region on the connecting portion 17. Since the conductive material solution permeates the space 18, the upper electrodes 23 are not short-circuited with each other.

Figure 12A:
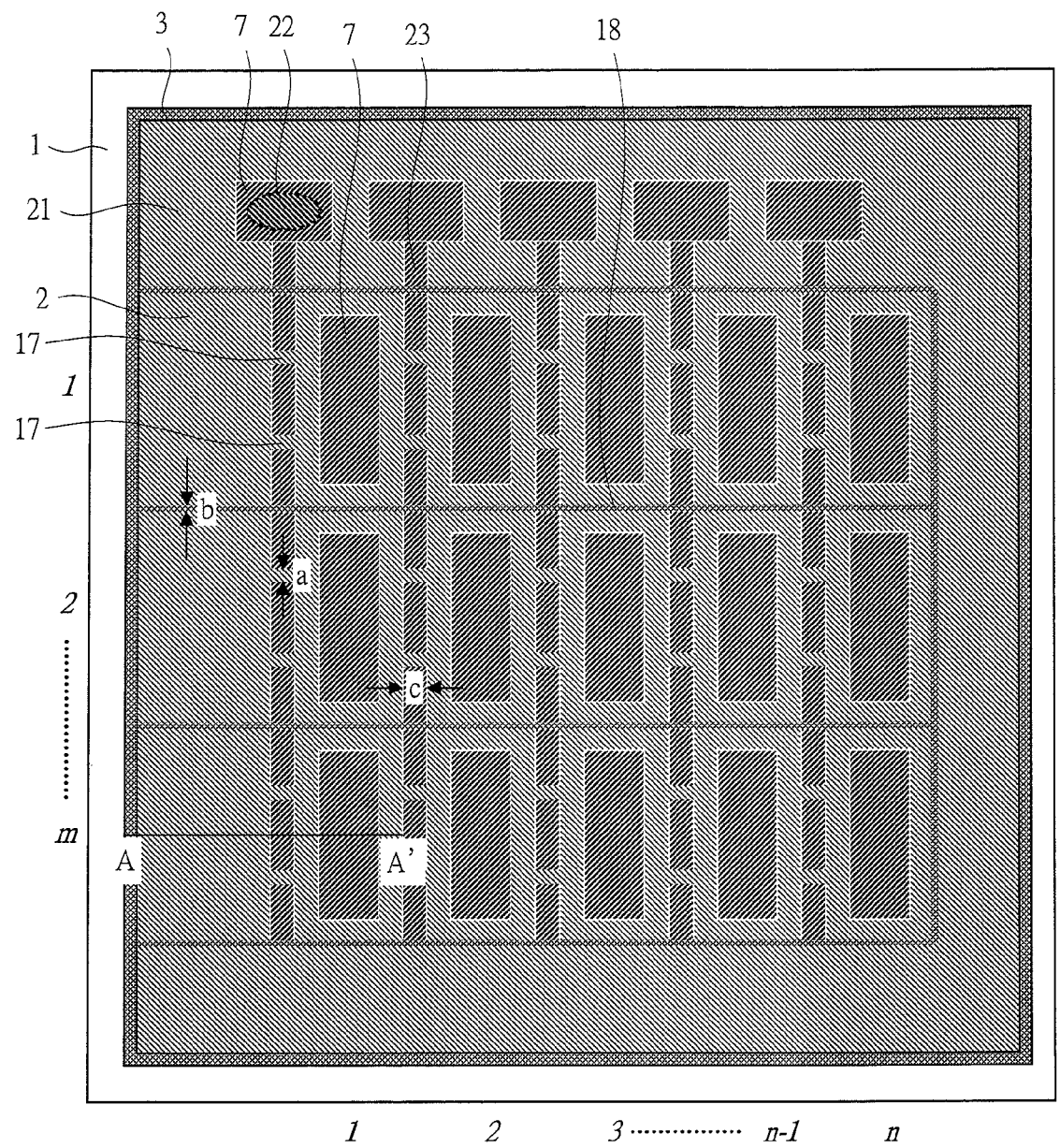
FIG. 12A is a plan view showing a manufacturing step of the transistor according to the fourth embodiment of the present invention.
Figure 12B:
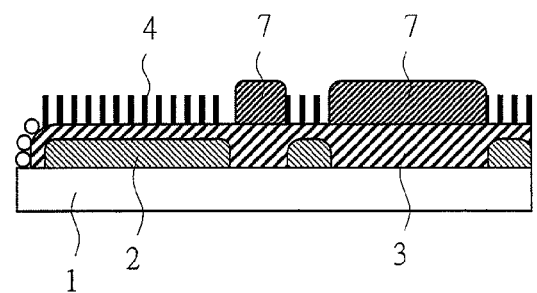
FIG. 12B is a sectional view showing the manufacturing step of the transistor according to the fourth embodiment of the present invention.
Figure 13A:
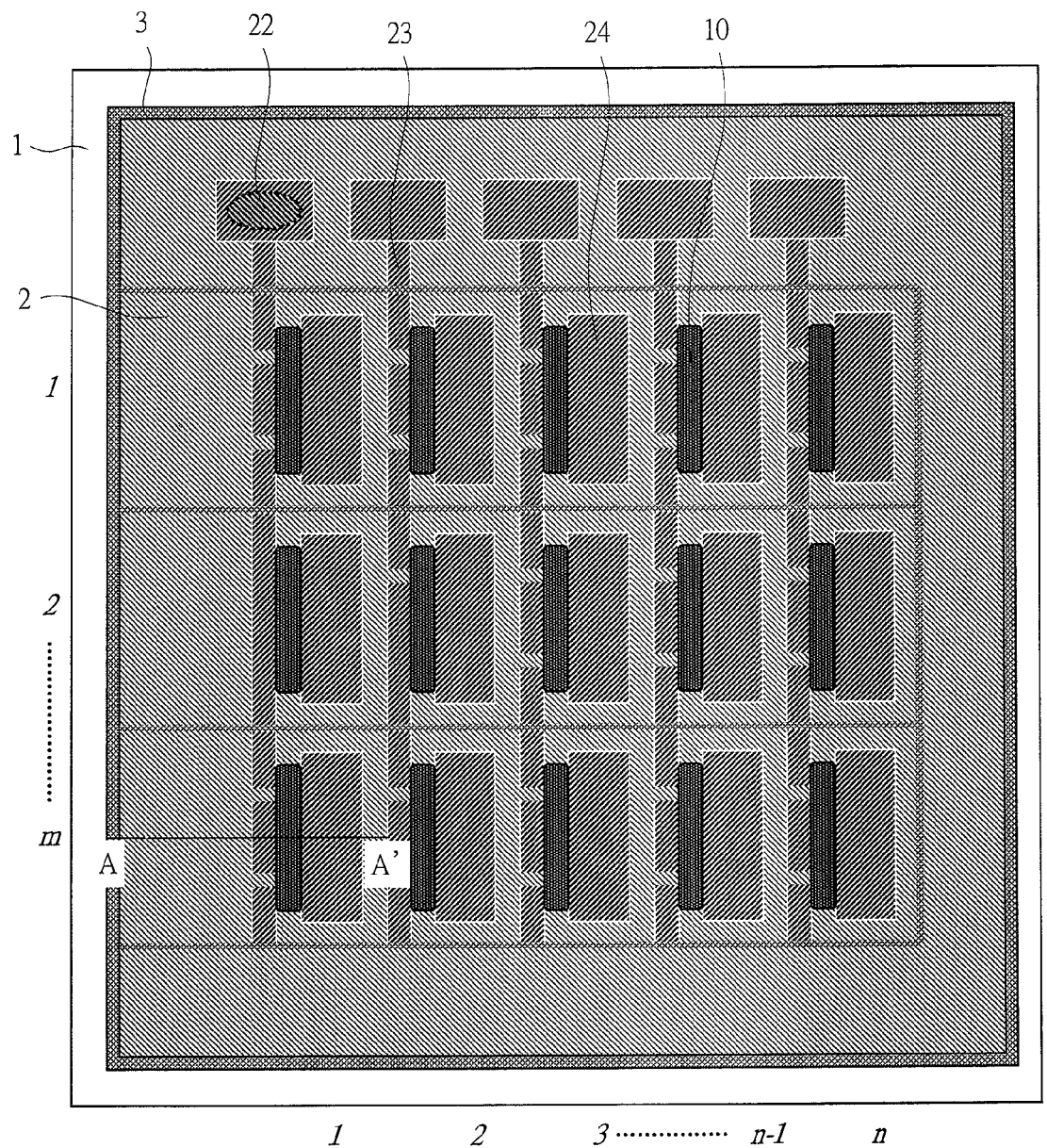
FIG. 13A is a plan view showing a manufacturing step of the transistor according to the fourth embodiment of the present invention.
Figure 13B:
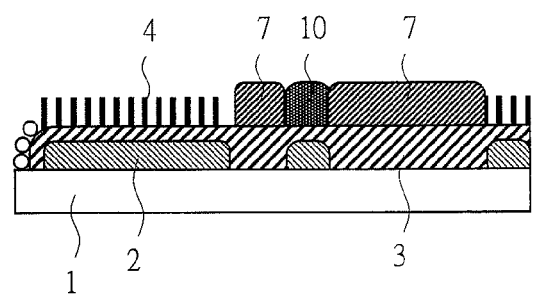
FIG. 13B is a sectional view showing the manufacturing step of the transistor according to the fourth embodiment of the present invention.
Figure 14A:
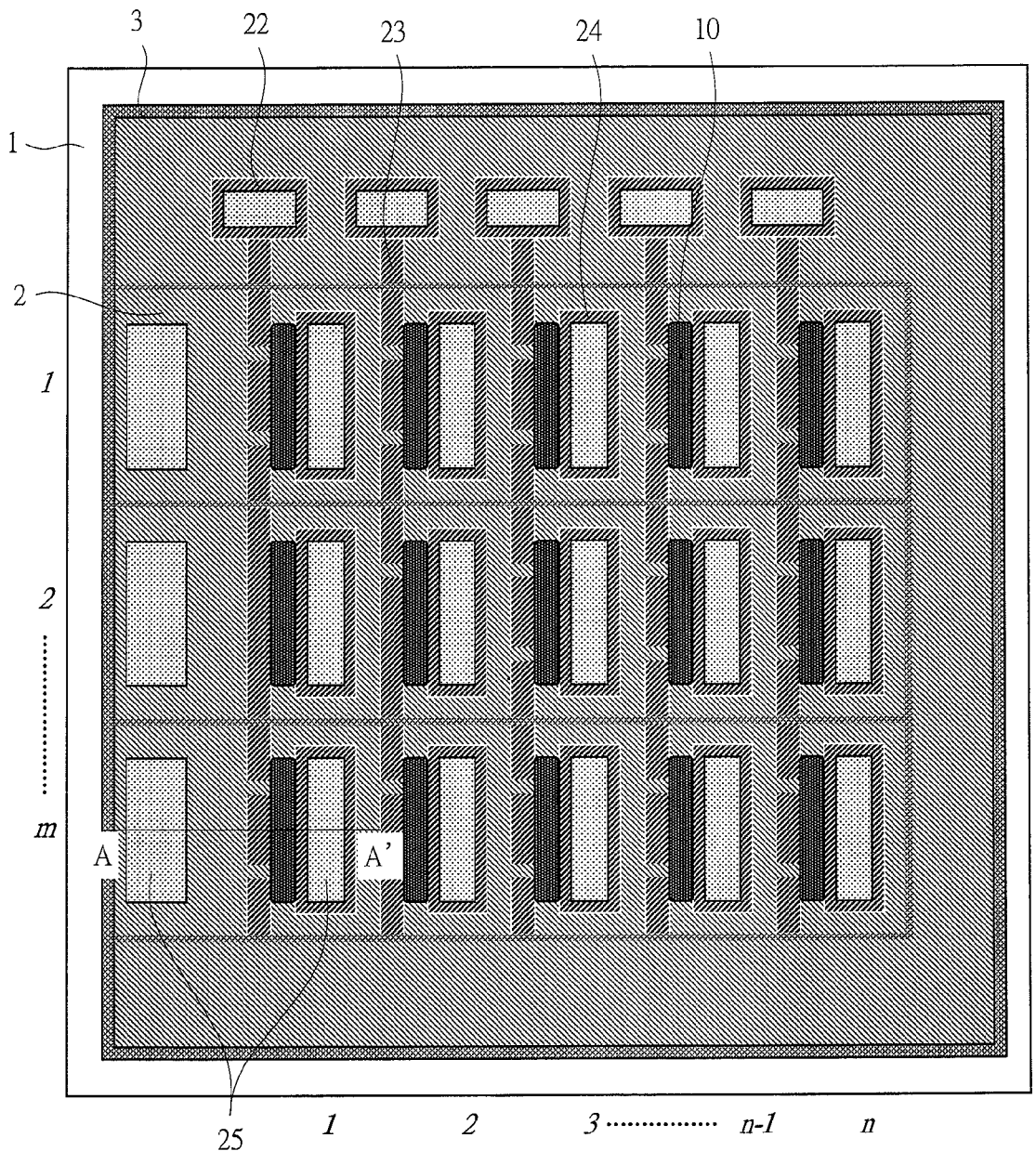
FIG. 14A is a plan view showing a manufacturing step of the transistor according to the fourth embodiment of the present invention.
Figure 14B:
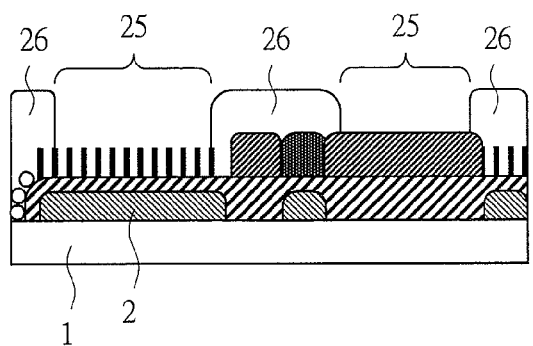
FIG. 14B is a sectional view showing the manufacturing step of the transistor according to the fourth embodiment of the present invention.

Further, in this embodiment, a lower electrode for terminal formation 21 formed integrally as a part of the lower electrode 2 is disposed so as to surround the outer peripheries of the m gate wirings/electrodes 2. In order to prevent the upper electrode 23 from being formed at an end portion of the substrate 1 outside the lower electrode for terminal formation 21, it is only necessary to attach a sealing mask on this portion and remove the same after the upper electrode 23 is formed. Further, in this embodiment, the width of a signal terminal portion 22 of the lower electrode for terminal formation 21 is designed to be wider than the upper electrode width c. This is not only for increasing the area of the upper electrode terminal simply to reduce contact resistance with a signal circuit to be described later, but also for utilizing the signal terminal portion 22 as an inkholder for the conductive material solution applied to form the relatively long signal wiring 23. More specifically, when the conductive material solution is dropped too much along the space with the width c for forming the signal wiring 23, the conductive material solution flows into the signal terminal portion 22, and when the conductive material solution is dropped too little, the conductive material solution is supplied from the signal terminal 22, so that the upper electrode 23 is formed with a proper amount of the conductive material solution (top view: FIG. 12A, sectional view: FIG. 12B). A semiconductor film 10 is formed on this electrode substrate by using the same materials and methods as those in the third embodiment, and the m×n thin film transistors are formed at the intersecting portions of the m gate wirings 2 and the n signal wirings 23 (top view: FIG. 13A, sectional view: FIG. 13B). Further, a protection film 26 is formed thereon. At this time, through holes 25 are formed to form the wirings therein. In this manner, a self-aligned active matrix thin film transistor substrate can be formed (top view: FIG. 14A, sectional view: FIG. 14B). When a matrix of transistors is formed in this manner and the performances of the respective transistors are compared, it is found that transistors having no variation in performance and extremely the same performance can be fabricated.

Fifth Embodiment

Figure 15A:
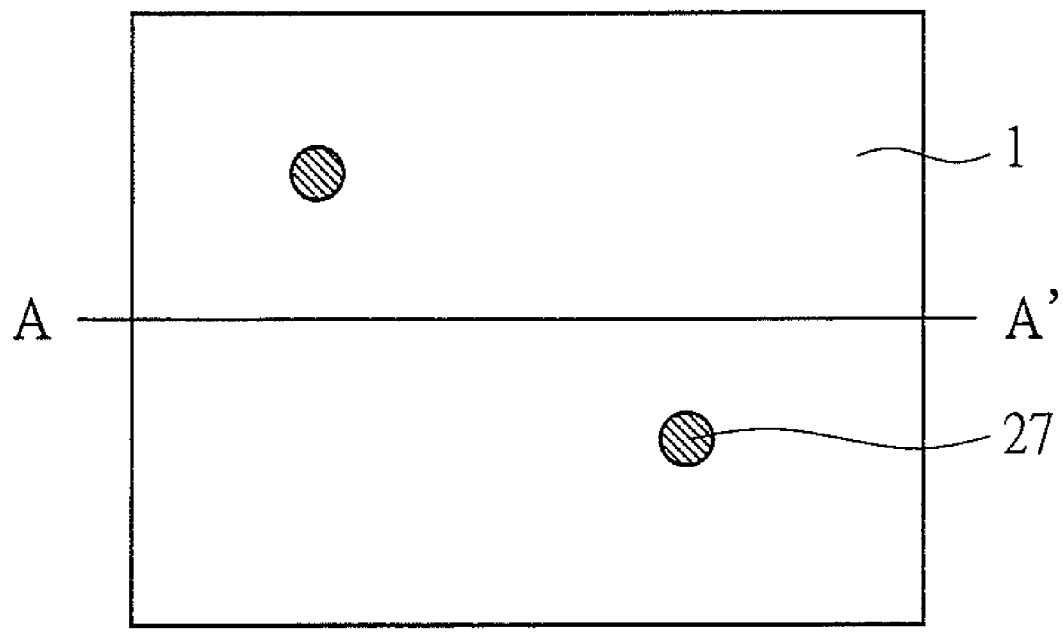
FIG. 15A is a plan view showing a manufacturing step of a wiring substrate according to a fifth embodiment of the present invention.
Figure 15B:
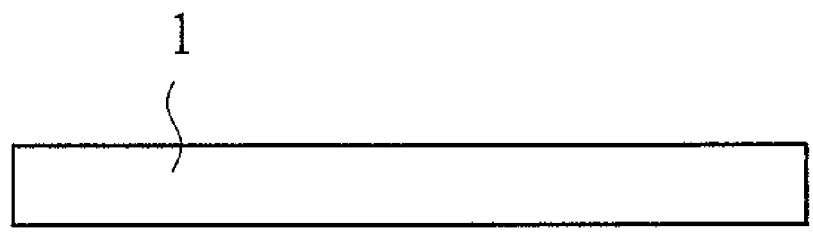
FIG. 15B is a sectional view showing a manufacturing step of the wiring substrate according to the fifth embodiment of the present invention.
Figure 16A:
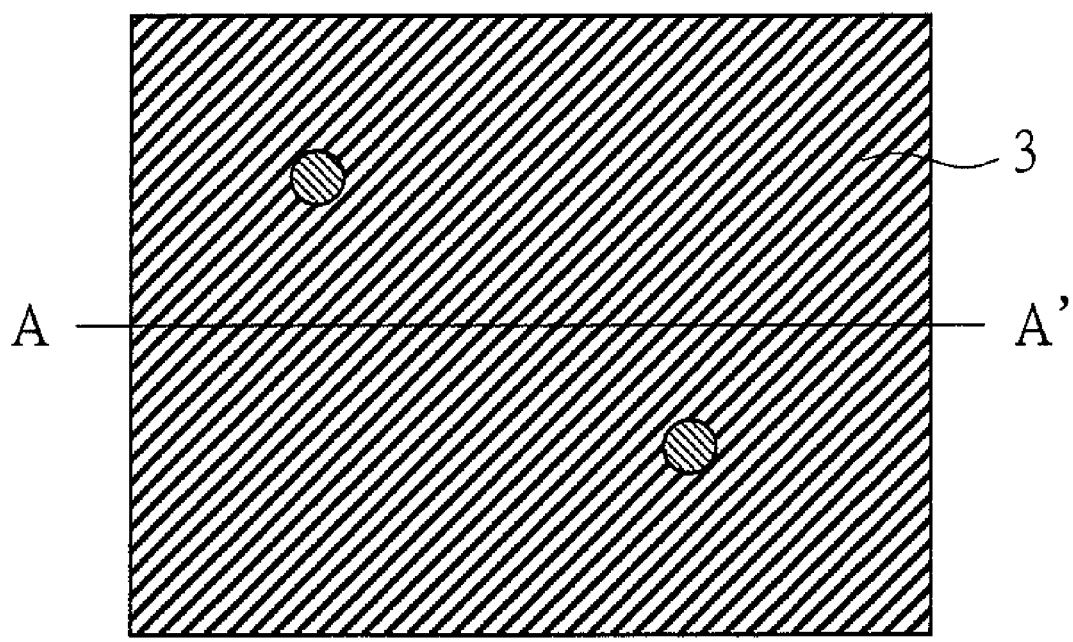
FIG. 16A is a plan view showing a manufacturing step of the wiring substrate according to the fifth embodiment of the present invention.
Figure 16B:
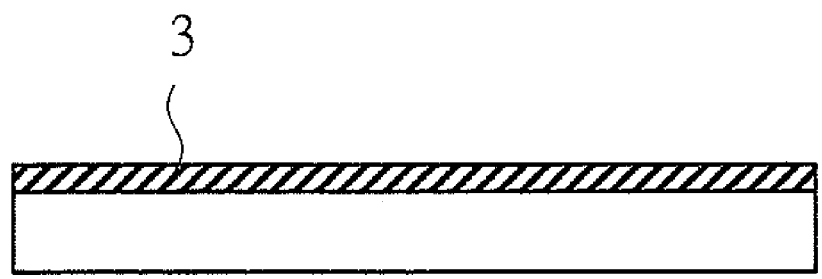
FIG. 16B is a sectional view showing the manufacturing step of the wiring substrate according to the fifth embodiment of the present invention.
Figure 17A:
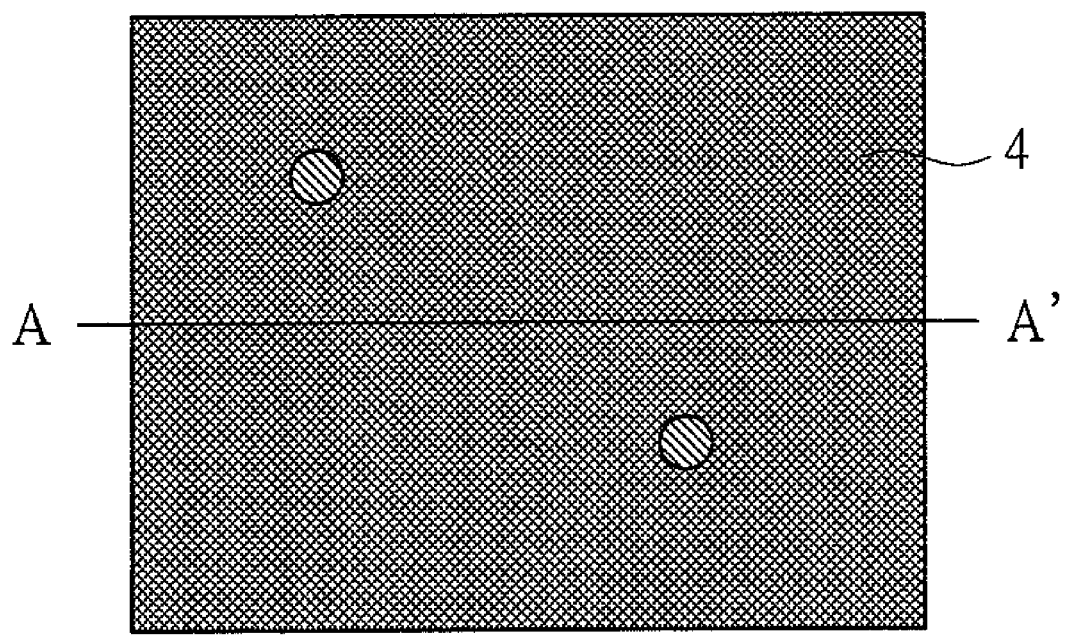
FIG. 17A is a plan view showing a manufacturing step of the wiring substrate according to the fifth embodiment of the present invention.
Figure 17B:
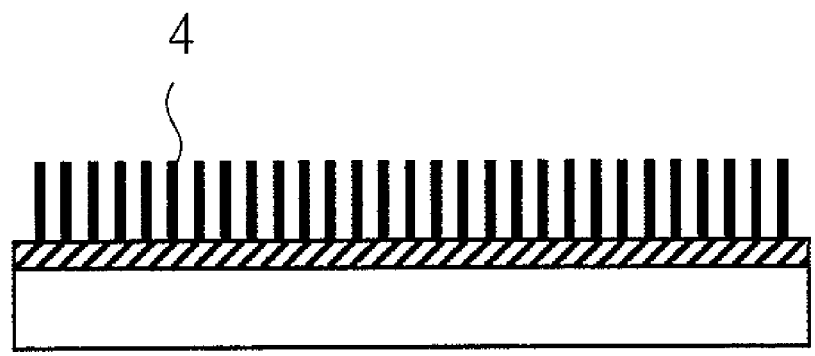
FIG. 17B is a sectional view showing the manufacturing step of the wiring substrate according to the fifth embodiment of the present invention.
Figure 18A:
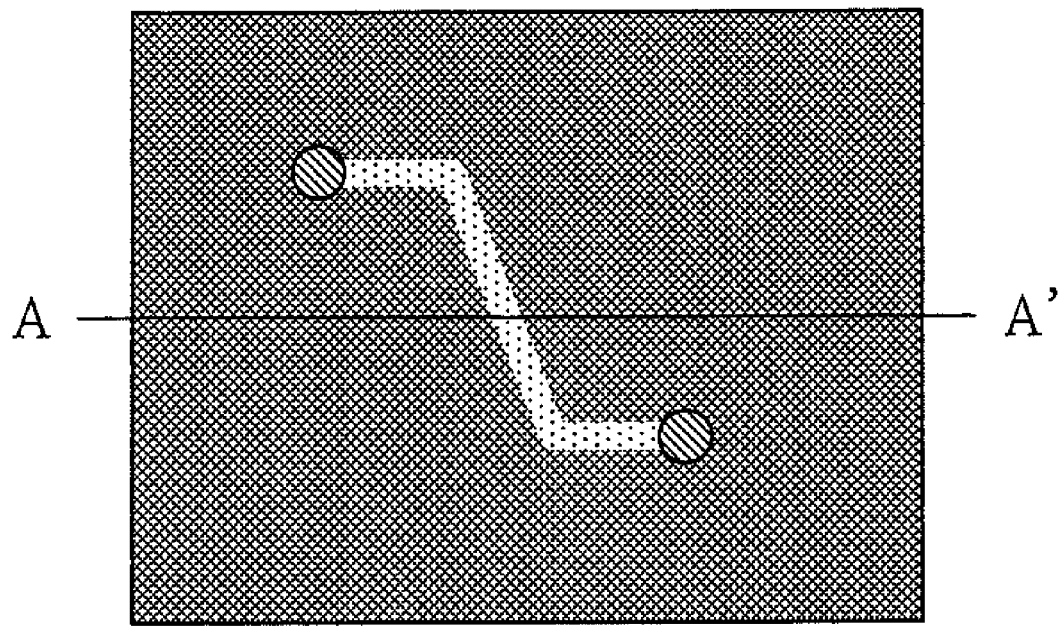
FIG. 18A is a plan view showing a manufacturing step of the wiring substrate according to the fifth embodiment of the present invention.
Figure 18B:
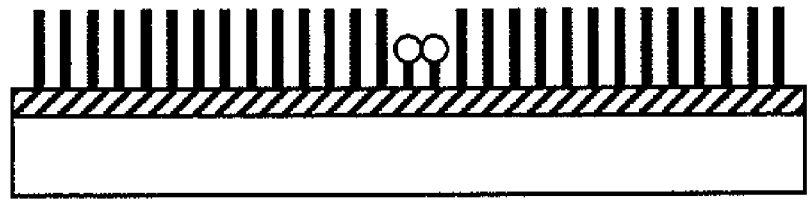
FIG. 18B is a sectional view showing the manufacturing step of the wiring substrate according to the fifth embodiment of the present invention.
Figure 19A:
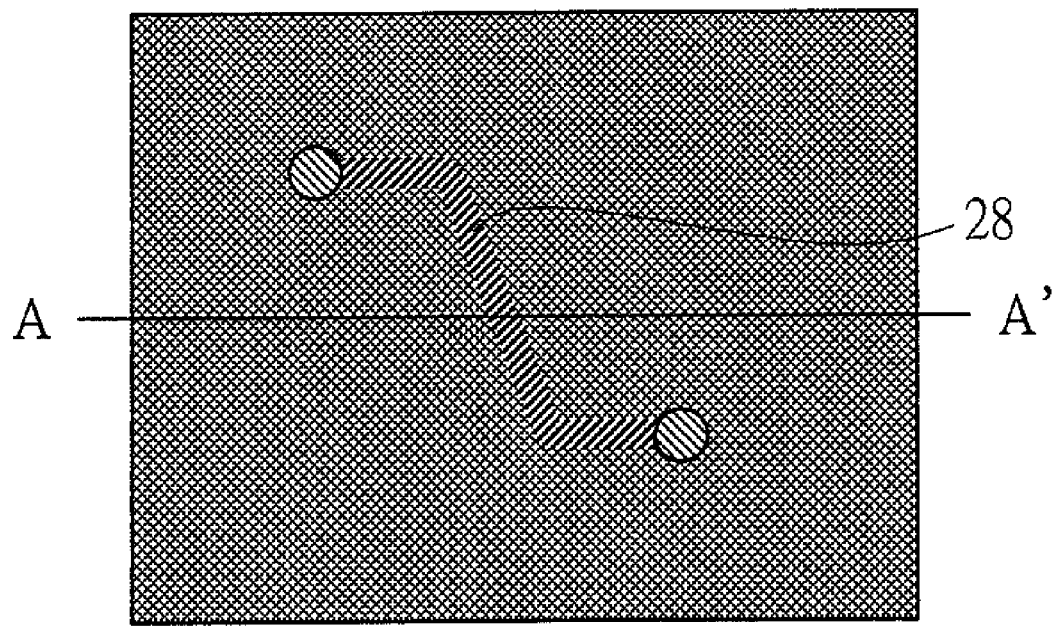
FIG. 19A is a plan view showing a manufacturing step of the wiring substrate according to the fifth embodiment of the present invention.
Figure 19B:
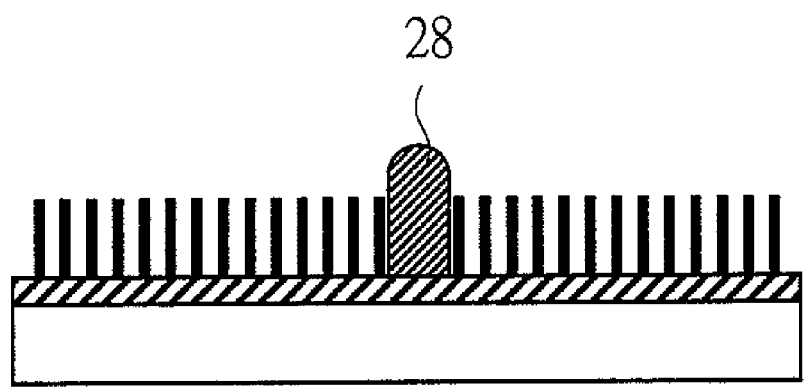
FIG. 19B is a sectional view showing the manufacturing step of the wiring substrate according to the fifth embodiment of the present invention.
Figure 20:
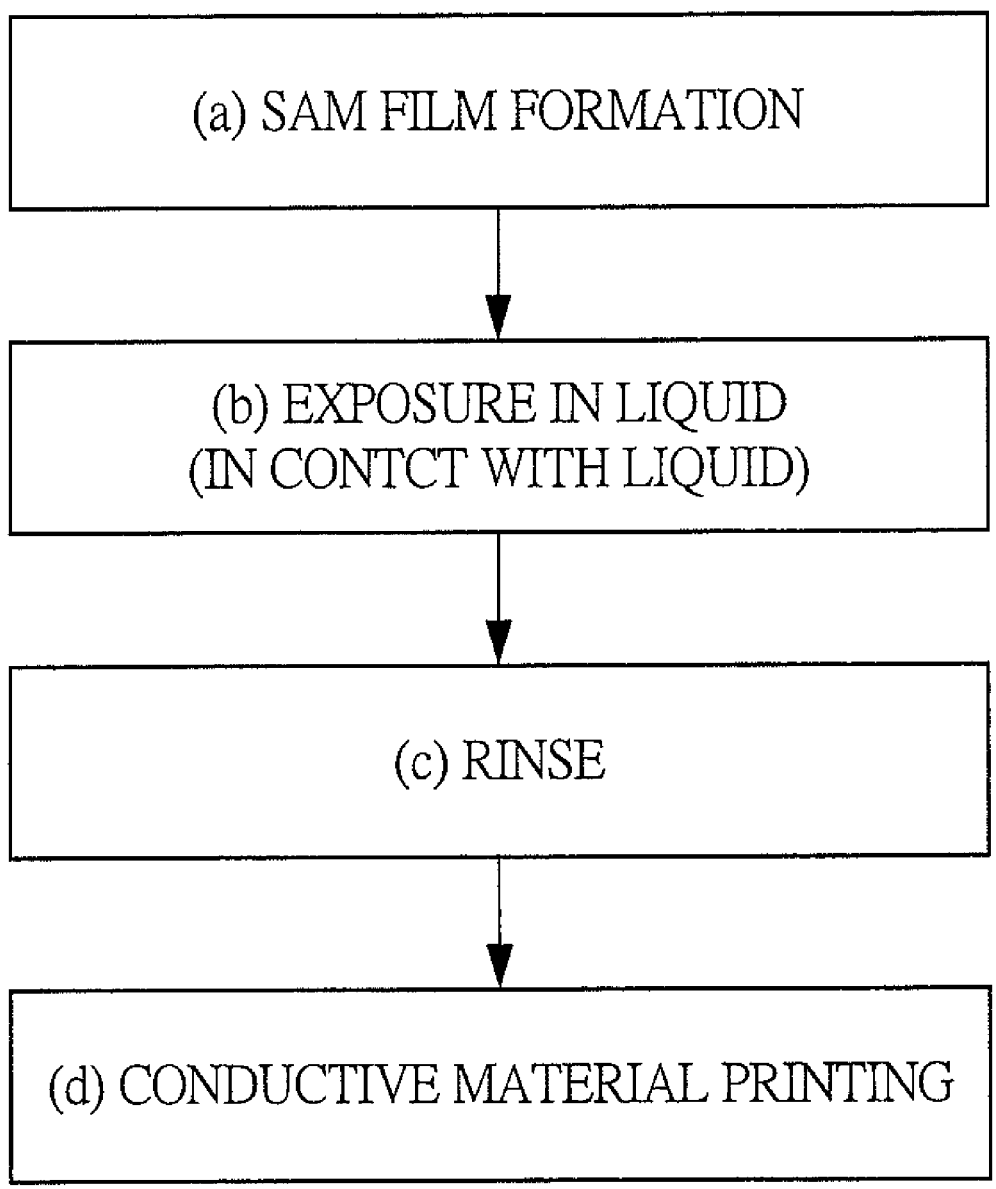
FIG. 20 is a process flowchart of the present invention.

A printed substrate 1 (made of epoxy resin) subjected only to a process of forming through holes 27 (top view: FIG. 15A, sectional view: FIG. 15B) is prepared, and a wiring portion is fabricated. 2% methyl isobutyl ketone solution of poly(methyl silsesquioxane) is applied on the substrate by the spin-coating method and is subjected to a heat treatment for 20 minutes at 150° C. (top view: FIG. 16A, sectional view: FIG. 16B). Thereafter, the substrate is dipped for 10 minutes in 0.1% toluene solution of the photo-sensitive self-assembled-monolayer material (5-methoxy-2-nitro-benzyl 4-(trimethoxysilyl)butanesulfonate), rinsed with toluene, dried, and then burned for 10 minutes at 110° C., thereby forming the photo-sensitive self-assembled-monolayer 4 (top view: FIG. 17A, sectional view: FIG. 17B). Further, by using a laser exposure apparatus having a pattern drawing function, exposure between the through holes is performed with a wavelength of 355 nm. Thereafter, the substrate is dipped in a tetramethylammonium hydroxide 2.38 w % aqueous solution for one minute, and washed with water (top view: FIG. 18A, sectional view: FIG. 18B). A pattern is drawn at an exposed portion with using copper nanoparticles dispersed in toluene solution as ink by the ink-jet method and burned for 10 minutes at 180° C., thereby forming a wiring 28 between the through holes (top view: FIG. 19A, sectional view: FIG. 19B). This substrate can be used without any difference from a commercially-available wiring substrate.

Incidentally, explanation of reference numerals used in the figures of this application is as follows.

1 . . . substrate, 2 . . . lower electrode, gate wiring/electrode, 3 . . . gate insulating film, 4 . . . photo-sensitive self-assembled-monolayer, 5 . . . exposure light, 6 . . . self-assembled-monolayer whose contact angle of water is decreased due to an organic alkali treatment after exposure, 7 . . . upper electrode, source and drain electrodes, 8 . . . wiring, 9 . . . wiring, 10 . . . organic semiconductor, 11 . . . wiring, 17 . . . connecting portion of gate wiring, 18 . . . space between adjacent gate wirings/electrodes, 21 . . . lower electrode for signal terminal formation, 22 . . . signal terminal, 23 . . . source electrode, 24 . . . drain electrode, 25 . . . through hole, 26 protection film, 27 . . . through hole, 28 . . . wiring, 29 . . . container for exposure, 30 . . . substrate obtained after the step of forming a photo-sensitive SAM has been completed, 31 . . . alkaline aqueous solution or organic solvent, 32 . . . exposure light source, 33 . . . lens system, 34 . . . mirror system, 35 . . . exposure light

What is claimed is:

1. A method for exposing a photo-sensitive SAM film, comprising the steps of:
   forming on a substrate a self-assembled-monolayer (photo-sensitive SAM film) having photo-sensitivity, exhibiting hydrophobicity before exposure, and exhibiting hydrophilicity after exposure; and
   performing exposure to the substrate in a state in which a surface of the substrate on which the film has been formed is dipped in liquid or in a state in which a light-sensitive surface of the substrate faces downward to be in contact with liquid,
   wherein exposure light is ultraviolet light, visible light, or light with an exposure-wavelength of 350 nm or more to 800 nm or less, and
   wherein the liquid is at least one of organic solvent containing an aromatic group and organic solvent of alcohols, ethers, or ketones.

2. A method for manufacturing a semiconductor device, comprising the steps of:
   forming a gate electrode on a substrate, forming a gate insulating film on the substrate and the gate electrode, and forming a photo-sensitive SAM film on the gate insulating film by a coating method with using a conductive material in a solution state as a raw material;
   performing exposure to the substrate in a state in which a surface of the substrate on which the SAM film has been formed is dipped in liquid or in a state in which a light-sensitive surface of the substrate faces downward to be in contact with liquid; and
   removing an exposed portion in the SAM film and forming a pair of a source electrode and a drain electrode on the gate insulating film exposed by the removing,
   wherein exposure light is ultraviolet light, visible light, or light with an exposure-wavelength of 350 nm or more to 800 nm or less, and
   wherein the liquid is at least one of organic solvent containing an aromatic group and organic solvent of alcohols, ethers, or ketones.

3. The method for manufacturing a semiconductor device according to claim 2,
   wherein materials constituting the substrate and the insulating film are translucent to an exposure-wavelength,
   wherein a material constituting the gate electrode is non-translucent to the exposure-wavelength, and
   wherein a material of the source and drain electrodes is made of metal nanoparticle solution or conductive polymer solution, and a pair of the source and drain electrodes are both formed by exposure from a rear surface of the substrate.

4. The method for manufacturing a semiconductor device according to claim 2,
   wherein the insulating film, the gate electrode, and the source and drain electrodes are formed by a printing method.

5. The method for manufacturing a semiconductor device according to claim 2,
   wherein the photo-sensitive self-assembled-monolayer (photo-sensitive SAM) changes in a value of a contact angle between the substrate and water or organic solvent before and after an exposing step.

6. The method for manufacturing a semiconductor device according to claim 2, wherein the liquid used when the photo-sensitive self-assembled-monolayer is exposed is alkaline aqueous solution or organic solvent.

7. The method for manufacturing a semiconductor device according to claim 2,
wherein an exposing step for forming the pair of source and drain electrodes comprises the steps of:
forming a nontranslucent gate electrode on a translucent substrate;
forming a gate insulating film covering at least the gate electrode;
forming a photo-sensitive self-assembled-monolayer (photo-sensitive SAM) covering at least the insulating film;
dipping the translucent substrate in organic alkaline aqueous solution or organic solvent and exposing the same from a rear surface of the substrate, thereby fabricating an electrode;
washing the substrate with water after the exposure;
forming source and drain electrodes in the exposed portion using conductive material solution; and
forming an organic semiconductor layer for forming a channel portion.

8. The method for manufacturing a semiconductor device according to claim 2,
wherein an exposing step for forming the pair of source and drain electrodes comprises the steps of:
forming a nontranslucent gate electrode on a translucent substrate;
forming a gate insulating film covering at least the gate electrode;
forming a photo-sensitive self-assembled-monolayer (photo-sensitive SAM) covering at least the insulating film;
bringing a surface of the translucent substrate into contact with organic alkaline aqueous solution or organic solvent and exposing the substrate from a rear surface of the substrate, thereby fabricating an electrode;
washing the substrate with water after the exposure;
forming source and drain electrodes in the exposed portion using conductive material solution; and
forming an organic semiconductor layer for forming a channel portion.

9. The method for manufacturing a semiconductor device according to claim 2,
wherein a step of forming an organic semiconductor film is performed after a step of forming an electrode material layer.

10. The method for manufacturing a semiconductor device according to claim 2,
wherein the substrate is a flexible substrate.

11. The method for manufacturing a semiconductor device according to claim 2,
wherein the substrate is made of silicon compound or organic compound.

12. The method for manufacturing a semiconductor device according to claim 2,
wherein the exposure light from a rear surface of a translucent substrate has a light absorbing wavelength of the photo-sensitive self-assembled-monolayer (photo-sensitive SAM).

13. The method for manufacturing a semiconductor device according to claim 2,
wherein the coating method uses at least one of methods selected from a group including an ink-jet method, a micro-dispensing method, a casting method, a dipping method, and a transfer method.

* * * * *